US011223370B2

(12) United States Patent
Noh et al.

(10) Patent No.: US 11,223,370 B2
(45) Date of Patent: Jan. 11, 2022

(54) METHOD AND APPARATUS FOR TRANSMITTING INFORMATION

(71) Applicant: LG Electronics Inc., Seoul (KR)

(72) Inventors: Kwangseok Noh, Seoul (KR); Bonghoe Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 151 days.

(21) Appl. No.: 16/065,676

(22) PCT Filed: Feb. 14, 2018

(86) PCT No.: PCT/KR2018/001980
§ 371 (c)(1),
(2) Date: Jun. 22, 2018

(87) PCT Pub. No.: WO2018/151555
PCT Pub. Date: Aug. 23, 2018

(65) Prior Publication Data
US 2021/0203361 A1 Jul. 1, 2021

Related U.S. Application Data

(60) Provisional application No. 62/460,535, filed on Feb. 17, 2017, provisional application No. 62/504,486, filed on May 10, 2017, provisional application No. 62/507,118, filed on May 16, 2017.

(51) Int. Cl.
*H03M 13/13* (2006.01)
*H04L 1/00* (2006.01)

(52) U.S. Cl.
CPC .......... *H03M 13/13* (2013.01); *H04L 1/0061* (2013.01)

(58) Field of Classification Search
CPC ............................ H03M 13/13; H04L 1/0061
See application file for complete search history.

(56) References Cited

U.S. PATENT DOCUMENTS

| 2016/0182187 A1* | 6/2016 | Kim ...................... H04L 1/1861 714/807 |
| 2018/0152950 A1* | 5/2018 | Xiong ................. H04W 74/004 |
| 2018/0198467 A1* | 7/2018 | Nammi ................. H04L 1/0002 |
| 2019/0097756 A1* | 3/2019 | Chatterjee ............. H04L 1/0061 |

FOREIGN PATENT DOCUMENTS

WO   WO201700023079   2/2017

OTHER PUBLICATIONS

AT&T, "Polar Code Design for DCI," 3GPP TSG RAN WG1 Meeting #88, dated Feb. 13-17, 2017, 4 pages.
(Continued)

*Primary Examiner* — Thien Nguyen
(74) *Attorney, Agent, or Firm* — Fish & Richardson P.C.

(57) ABSTRACT

In a wireless communication system, a transmission device inputs, in some of N input bit positions of a polar code having the size N, input bits including D-bit information and X-bit user equipment (UE) ID according to a predetermined bit allocation sequence. The transmission device encodes the input bits by using the polar code. The transmission device transmits an encoded output sequence.

6 Claims, 12 Drawing Sheets

(56) References Cited

OTHER PUBLICATIONS

Coherent Logix Inc., "Eady block discrimination with polar codes to further accelerate DCI blind detection," 3GPP TSG RAN WG1 Meeting #88, dated Feb. 13-17, 2017, 6 pages.
Huawei et al., "Performance evaluation of channel coding schemes for collrol channel," 3GPP TSG RAN WG1 Meeting #87, dated Nov. 14-18, 2016, 12 pages.
Intel Corporation, "Design aspects of Polar Code for control channels," 3GPP TSG RAN WG1 Meeting #88, dated Feb. 13-17, 2017, 5 pages.
International Search Report in International Application No. PCT/KR2018/001980, dated Jul. 3, 2018, 11 pages.

* cited by examiner

☐ : systematic bit   ▦ : RV point
▨ : Parity 0   ▨ : Parity 1

(a) | ABCD | ABCD | ABCD | ABCD |
(b) | AAAA | BBBB | CCCC | DDDD |

(c) | ABCD | ABCD | ABCD | AB |
(d) | AAAA | BBBB | CCCD | DD |

METHOD AND APPARATUS FOR TRANSMITTING INFORMATION

CROSS-REFERENCE TO RELATED APPLICATIONS

This application is a National Stage application under 35 U.S.C. § 371 of International Application No. PCT/KR2018/001980, filed on Feb. 14, 2018, which claims the benefit of U.S. Provisional Application No. 62/507,118, filed on May 16, 2017, U.S. Provisional Application No. 62/504,486, filed on May 10, 2017, and U.S. Provisional Application No. 62/460,535, filed on Feb. 17, 2017. The disclosures of the prior applications are incorporated by reference in their entirety.

TECHNICAL FIELD

The present invention relates to a wireless communication system and, more particularly, to a method and apparatus for transmitting information.

BACKGROUND ART

With appearance and spread of machine-to-machine (M2M) communication, machine type communication (MTC) and a variety of devices such as smartphones and tablet Personal Computers (PCs) and technology demanding a large amount of data transmission, data throughput needed in a cellular network has rapidly increased. To satisfy such rapidly increasing data throughput, carrier aggregation technology, cognitive radio technology, etc. for efficiently employing more frequency bands and multiple input multiple output (MIMO) technology, multi-base station (BS) cooperation technology, etc. for raising data capacity transmitted on limited frequency resources have been developed.

As more communication devices have demanded higher communication capacity, there has been necessity of enhanced mobile broadband (eMBB) relative to legacy radio access technology (RAT). In addition, massive machine type communication (mMTC) for providing various services anytime and anywhere by connecting a plurality of devices and objects to each other is one main issue to be considered in future-generation communication.

Further, a communication system to be designed in consideration of services/UEs sensitive to reliability and latency is under discussion. The introduction of future-generation RAT has been discussed by taking into consideration eMBB communication, mMTC, ultra-reliable and low-latency communication (URLLC), and the like.

DISCLOSURE

Technical Problem

Due to introduction of new radio communication technology, the number of user equipments (UEs) to which a BS should provide a service in a prescribed resource region increases and the amount of data and control information that the BS should transmit to the UEs increases. Since the amount of resources available to the BS for communication with the UE(s) is limited, a new method in which the BS efficiently receives/transmits uplink/downlink data and/or uplink/downlink control information using the limited radio resources is needed. In other words, as the density of nodes and/or the density of UEs increases, a method of efficiently using high-density nodes or high-density UEs for communication is needed.

With development of technologies, overcoming delay or latency has become an important challenge. Applications whose performance critically depends on delay/latency are increasing. Accordingly, a method to reduce delay/latency compared to the legacy system is demanded.

In addition, with development of smart devices, a new method of efficiently transmitting/receiving small volumes of data or efficiently transmitting/receiving data generated with a low frequency is needed.

Furthermore, with advances in technology, use of frequency bands that have not conventionally used has been discussed. Since newly introduced frequency bands differ in characteristics from legacy frequency bands, it is difficult to apply legacy communication technology to newly introduced communication technology. Hence, introduction of communication technology suitable for frequency bands used for new communication is required.

The technical objects that can be achieved through the present invention are not limited to what has been particularly described hereinabove and other technical objects not described herein will be more clearly understood by persons skilled in the art from the following detailed description.

Technical Solution

According to an aspect of the present invention, provided herein is a method of transmitting information by a transmitting device in a wireless communication system. The method includes: inputting input bits including D-bit information and an X-bit user equipment (UE) ID to a part of N input bit positions of a size-N polar code according to a specific bit allocation sequence; encoding the input bits using the polar code; and transmitting an encoded output sequence.

According to another aspect of the present invention, provided herein is a transmitting device for transmitting information in a wireless communication system. The transmitting device includes a radio frequency (RF) unit, and a processor configured to control the RF unit. The processor may be configured to: input input bits including D-bit information and an X-bit user equipment (UE) ID to a part of N input bit positions of a size-N polar code according to a specific bit allocation sequence; encode the input bits using the polar code; and control the RF unit to transmit an encoded output sequence.

In each aspect of the present invention, the N input bit positions may be divided into information bit positions and frozen bit positions. The information bit positions may be D input bit positions having high reliabilities among the N input bit positions. The UE ID may be input to input position(s) having high reliabilities among the frozen bit positions.

In each aspect of the present invention, the UE ID may be input to X information bit positions among the information bit positions.

In each aspect of the present invention, a part of the D-bit information may be input to remaining information bit positions except for the X information bit positions to which the UE ID is input among the information bit positions and the other information bit(s) among the D-bit information may be input to frozen bit position(s) having high reliabilities among the frozen bit positions.

In each aspect of the present invention, the other information bit(s) may be information bit(s) corresponding to the information bit positions to which the UE ID is input among the D-bit information.

In each aspect of the present invention, the other information bit(s) may be information bit(s) positioned at an end of the D-bit information.

In each aspect of the present invention, the UE ID may be a UE ID of the transmitting device or a UE ID of a receiving device which is a destination of the D-bit information.

The above technical solutions are merely some parts of the embodiments of the present invention and various embodiments into which the technical features of the present invention are incorporated can be derived and understood by persons skilled in the art from the following detailed description of the present invention.

Advantageous Effects

According to an example of the present invention, uplink/downlink signals can be efficiently transmitted/received. Therefore, overall throughput of a radio communication system can be improved.

According to an example of the present invention, delay/latency occurring during communication between a user equipment and a base station may be reduced.

In addition, it is possible to efficiently transmit/receive not only a small amount of data but also data which occurs infrequently.

In addition, signals can be transmitted/received efficiently and at a low error rate in a wireless communication system.

It will be appreciated by persons skilled in the art that that the effects that can be achieved through the present invention are not limited to what has been particularly described hereinabove and other advantages of the present invention will be more clearly understood from the following detailed description.

BRIEF DESCRIPTION OF THE DRAWINGS

The accompanying drawings, which are included to provide a further understanding of the invention, illustrate embodiments of the invention and together with the description serve to explain the principle of the invention.

FIG. 12 illustrates sequences in which reserved or known bit(s) of the present invention are included.

MODE FOR CARRYING OUT THE INVENTION

Figure 1:
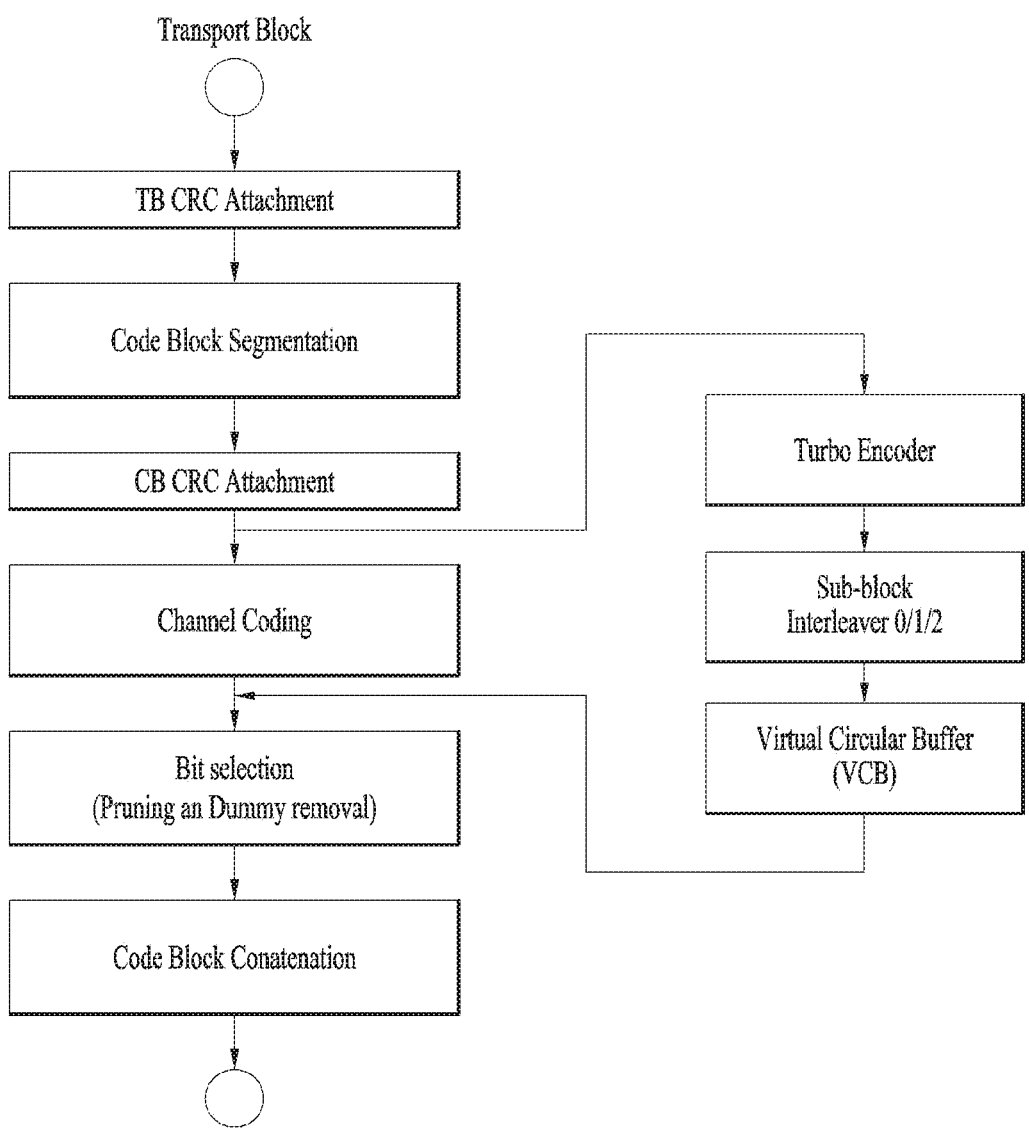
FIG. 1 illustrates a transport block processing procedure in an LTE/LTE-A system.

Reference will now be made in detail to the exemplary embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the invention. The following detailed description includes specific details in order to provide a thorough understanding of the present invention. However, it will be apparent to those skilled in the art that the present invention may be practiced without such specific details.

In some instances, known structures and devices are omitted or are shown in block diagram form, focusing on important features of the structures and devices, so as not to obscure the concept of the present invention. The same reference numbers will be used throughout this specification to refer to the same or like parts.

The following techniques, apparatuses, and systems may be applied to a variety of wireless multiple access systems. Examples of the multiple access systems include a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, and a multicarrier frequency division multiple access (MC-FDMA) system. CDMA may be embodied through radio technology such as universal terrestrial radio access (UTRA) or CDMA2000. TDMA may be embodied through radio technology such as global system for mobile communications (GSM), general packet radio service (GPRS), or enhanced data rates for GSM evolution (EDGE). OFDMA may be embodied through radio technology such as institute of electrical and electronics engineers (IEEE) 802.11 (Wi-Fi), IEEE 802.16 (WiMAX), IEEE 802.20, or evolved UTRA (E-UTRA). UTRA is a part of a universal mobile telecommunications system (UMTS). 3rd generation partnership project (3GPP) long term evolution (LTE) is a part of evolved UMTS (E-UMTS) using E-UTRA. 3GPP LTE employs OFDMA in DL and SC-FDMA in UL. LTE-advanced (LTE-A) is an evolved version of 3GPP LTE. For convenience of description, it is assumed that the present invention is applied to 3GPP based communication system, e.g. LTE/LTE-A, NR. However, the technical features of the present invention are not limited thereto. For example, although the following detailed description is given based on a mobile communication system corresponding to a 3GPP LTE/LTE-A/NR system, aspects of the present invention that are not specific to 3GPP LTE/LTE-A/NR are applicable to other mobile communication systems.

In examples of the present invention described below, the term "assume" may mean that a subject to transmit a channel transmits the channel in accordance with the corresponding "assumption". This may also mean that a subject to receive the channel receives or decodes the channel in a form conforming to the "assumption", on the assumption that the channel has been transmitted according to the "assumption".

In the present invention, a user equipment (UE) may be a fixed or mobile device. Examples of the UE include various devices that transmit and receive user data and/or various kinds of control information to and from a base station (BS). The UE may be referred to as a terminal equipment (TE), a mobile station (MS), a mobile terminal (MT), a user terminal (UT), a subscriber station (SS), a wireless device, a personal digital assistant (PDA), a wireless modem, a handheld device, etc. In addition, in the present invention, a BS generally refers to a fixed station that performs communication with a UE and/or another BS, and exchanges various kinds of data and control information with the UE and another BS. The BS may be referred to as an advanced base station (ABS), a node-B (NB), an evolved node-B (eNB), a base transceiver system (BTS), an access point (AP), a processing server (PS), etc. Particularly, a BS of a UTRAN is referred to as a Node-B, a BS of an E-UTRAN is referred to as an eNB, and a BS of a new radio access technology network is referred to as an eNB. In describing the present invention, a BS will be referred to as an eNB.

In the present invention, a node refers to a fixed point capable of transmitting/receiving a radio signal through communication with a UE. Various types of eNBs may be used as nodes irrespective of the terms thereof. For example, a BS, a node B (NB), an e-node B (eNB), a pico-cell eNB (PeNB), a home eNB (HeNB), eNB, a relay, a repeater, etc. may be a node. In addition, the node may not be an eNB. For example, the node may be a radio remote head (RRH) or a radio remote unit (RRU). The RRH or RRU generally has a lower power level than a power level of an eNB. Since the RRH or RRU (hereinafter, RRH/RRU) is generally connected to the eNB through a dedicated line such as an optical cable, cooperative communication between RRH/RRU and the eNB can be smoothly performed in comparison with cooperative communication between eNBs connected by a radio line. At least one antenna is installed per node. The antenna may mean a physical antenna or mean an antenna port or a virtual antenna.

In the present invention, a cell refers to a prescribed geographical area to which one or more nodes provide a communication service. Accordingly, in the present invention, communicating with a specific cell may mean communicating with an eNB or a node which provides a communication service to the specific cell. In addition, a DL/UL signal of a specific cell refers to a DL/UL signal from/to an eNB or a node which provides a communication service to the specific cell. A node providing UL/DL communication services to a UE is called a serving node and a cell to which UL/DL communication services are provided by the serving node is especially called a serving cell. Furthermore, channel status/quality of a specific cell refers to channel status/quality of a channel or communication link formed between an eNB or node which provides a communication service to the specific cell and a UE. In the 3GPP based communication system, the UE may measure DL channel state received from a specific node using cell-specific reference signal(s) (CRS(s)) transmitted on a CRS resource and/or channel state information reference signal(s) (CSI-RS(s)) transmitted on a CSI-RS resource, allocated by antenna port(s) of the specific node to the specific node.

Meanwhile, a 3GPP based communication system uses the concept of a cell in order to manage radio resources and a cell associated with the radio resources is distinguished from a cell of a geographic region.

A "cell" of a geographic region may be understood as coverage within which a node can provide service using a carrier and a "cell" of a radio resource is associated with bandwidth (BW) which is a frequency range configured by the carrier. Since DL coverage, which is a range within which the node is capable of transmitting a valid signal, and UL coverage, which is a range within which the node is capable of receiving the valid signal from the UE, depends upon a carrier carrying the signal, the coverage of the node may be associated with coverage of the "cell" of a radio resource used by the node. Accordingly, the term "cell" may be used to indicate service coverage of the node sometimes, a radio resource at other times, or a range that a signal using a radio resource can reach with valid strength at other times.

Meanwhile, the 3GPP communication standards use the concept of a cell to manage radio resources. The "cell" associated with the radio resources is defined by combination of downlink resources and uplink resources, that is, combination of DL CC and UL CC. The cell may be configured by downlink resources only, or may be configured by downlink resources and uplink resources. If carrier aggregation is supported, linkage between a carrier frequency of the downlink resources (or DL CC) and a carrier frequency of the uplink resources (or UL CC) may be indicated by system information. For example, combination of the DL resources and the UL resources may be indicated by linkage of system information block type 2 (SIB2). The carrier frequency means a center frequency of each cell or CC. A cell operating on a primary frequency may be referred to as a primary cell (Pcell) or PCC, and a cell operating on a secondary frequency may be referred to as a secondary cell (Scell) or SCC. The carrier corresponding to the Pcell on downlink will be referred to as a downlink primary CC (DL PCC), and the carrier corresponding to the Pcell on uplink will be referred to as an uplink primary CC (UL PCC). A Scell means a cell that may be configured after completion of radio resource control (RRC) connection establishment and used to provide additional radio resources. The Scell may form a set of serving cells for the UE together with the Pcell in accordance with capabilities of the UE. The carrier corresponding to the Scell on the downlink will be referred to as downlink secondary CC (DL SCC), and the carrier corresponding to the Scell on the uplink will be referred to as uplink secondary CC (UL SCC). Although the UE is in RRC-CONNECTED state, if it is not configured by carrier aggregation or does not support carrier aggregation, a single serving cell configured by the Pcell only exists.

3GPP based communication standards define DL physical channels corresponding to resource elements carrying information derived from a higher layer and DL physical signals corresponding to resource elements which are used by a physical layer but which do not carry information derived from a higher layer. For example, a physical downlink shared channel (PDSCH), a physical broadcast channel (PBCH), a physical multicast channel (PMCH), a physical control format indicator channel (PCFICH), a physical downlink control channel (PDCCH), and a physical hybrid ARQ indicator channel (PHICH) are defined as the DL physical channels, and a reference signal and a synchronization signal are defined as the DL physical signals. A reference signal (RS), also called a pilot, refers to a special waveform of a predefined signal known to both a BS and a UE. For example, a cell-specific RS (CRS), a UE-specific RS (UE-RS), a positioning RS (PRS), and channel state information RS (CSI-RS) may be defined as DL RSs. Meanwhile, the 3GPP based communication standards define UL physical channels corresponding to resource elements carrying information derived from a higher layer and UL physical signals corresponding to resource elements which are used by a physical layer but which do not carry information derived from a higher layer. For example, a physical uplink shared channel (PUSCH), a physical uplink control channel (PUCCH), and a physical random access channel (PRACH) are defined as the UL physical channels, and a demodulation reference signal (DM RS) for a UL control/data signal and a sounding reference signal (SRS) used for UL channel measurement are defined as the UL physical signals.

In the present invention, a physical downlink control channel (PDCCH), a physical control format indicator channel (PCFICH), a physical hybrid automatic retransmit request indicator channel (PHICH), and a physical downlink shared channel (PDSCH) refer to a set of time-frequency resources or resource elements (REs) carrying downlink control information (DCI), a set of time-frequency resources or REs carrying a control format indicator (CFI), a set of time-frequency resources or REs carrying downlink acknowledgement (ACK)/negative ACK (NACK), and a set of time-frequency resources or REs carrying downlink data, respectively. In addition, a physical uplink control channel (PUCCH), a physical uplink shared channel (PUSCH) and a physical random access channel (PRACH) refer to a set of time-frequency resources or REs carrying uplink control information (UCI), a set of time-frequency resources or REs carrying uplink data and a set of time-frequency resources or REs carrying random access signals, respectively. In the present invention, in particular, a time-frequency resource or RE that is assigned to or belongs to PDCCH/PCFICH/PHICH/PDSCH/PUCCH/PUSCH/PRACH is referred to as PDCCH/PCFICH/PHICH/PDSCH/PUCCH/PUSCH/PRACH RE or PDCCH/PCFICH/PHICH/PDSCH/PUCCH/PUSCH/PRACH time-frequency resource, respectively. Therefore, in the present invention, PUCCH/PUSCH/PRACH transmission of a UE is conceptually identical to UCI/uplink data/random access signal transmission on PUSCH/PUCCH/PRACH, respectively. In addition, PDCCH/PCFICH/PHICH/PDSCH transmission of an eNB is conceptually identical to downlink data/DCI transmission on PDCCH/PCFICH/PHICH/PDSCH, respectively.

For terms and technologies which are not described in detail in the present invention, reference can be made to the standard document of 3GPP LTE/LTE-A, for example, 3GPP TS 36.211, 3GPP TS 36.212, 3GPP TS 36.213, 3GPP TS 36.321, and 3GPP TS 36.331 and the standard document of 3GPP NR, for example, 3GPP TS 38.xxx. In addition, as to polar codes and the principle of encoding and decoding using the polar codes, reference may be made to 'E. Arikan, "Channel Polarization: A Method for Constructing Capacity-Achieving Codes for Symmetric Binary-Input Memoryless Channels," in IEEE Transactions on Information Theory, vol. 55, no. 7, pp. 3051-3073, July 2009'.

As more communication devices have demanded higher communication capacity, there has been necessity of enhanced mobile broadband relative to legacy radio access technology (RAT). In addition, massive machine type communication for providing various services irrespective of time and place by connecting a plurality of devices and objects to each other is one main issue to be considered in future-generation communication. Further, a communication system design in which services/UEs sensitive to reliability and latency are considered is under discussion. The introduction of future-generation RAT has been discussed by taking into consideration enhanced mobile broadband communication, massive MTC, ultra-reliable and low-latency communication (URLLC), and the like. In current 3GPP, a study of the future-generation mobile communication system after EPC is being conducted. In the present invention, the corresponding technology is referred to as a new RAT (NR) or 5G RAT, for convenience.

An NR communication system demands that much better performance than a legacy fourth generation (4G) system be supported in terms of data rate, capacity, latency, energy consumption, and cost. Accordingly, the NR system needs to make progress in terms of bandwidth, spectrum, energy, signaling efficiency, and cost per bit. NR needs to use efficient waveforms in order to satisfy these requirements.

FIG. 1 illustrates a transport block processing procedure in an LTE/LTE-A system.

In order for a receiving side to correct errors that a channel experiences, a transmitting side encodes information using a forward error correction code and then transmits the encoded information. The receiving side demodulates a received signal and decodes the error correction code to thereby recover the information transmitted by the transmitting side. In this decoding procedure, errors in the received signal caused by a channel are corrected.

Data arrives at a coding block in the form of a maximum of two transport blocks every transmission time interval (TTI) in each DL/UL cell. The following coding steps may be applied to each transport block of the DL/UL cell:

cyclic redundancy check (CRC) attachment to a transport block;
code block segmentation and CRC attachment to a code block;
channel coding;
rate matching; and
code block concatenation.

Although various types of error correction codes are available, a turbo code has mainly been used in a legacy LTE/LTE-A system. The turbo code is implemented by a recursive systematic convolution encoder and an interleaver. For actual implementation of the turbo code, an interleaver is used to facilitate parallel decoding and quadratic polynomial permutation (QPP) is a kind of interleaving. It is known that a QPP interleaver maintains good performance only for a data block of a specific size. It is known that performance of the turbo code increases with a larger data block size. In an actual communication system, a data block of a predetermined size or larger is divided into a plurality of smaller data blocks and then is encoded, to facilitate actual implementation of coding. The smaller data blocks are called code blocks. While the code blocks are generally of the same size, one of the code blocks may have a different size due to a limited size of the QPP interleaver. Error correction coding is performed on each code block of a predetermined interleaver size and then interleaving is performed to reduce the impact of burst errors that are generated during transmission over a radio channel. The error-corrected and interleaved code block is transmitted by being mapped to an actual radio resource. The amount of radio resources used for actual transmission is designated. Thus, the encoded code blocks are rate-matched to the amount of the radio resources. In general, rate matching is performed through puncturing or repetition. For example, if the amount of radio resources, i.e., the number of transmission bits capable of being transmitted on the radio resources, is M and if a coded bit sequence, i.e., the number of output bits of the encoder, is N, in which M is different from N, then rate matching is performed to match the length of the coded bit sequence to M. If M>N, then all or a part of bits of the coded bit sequence are repeated to match the length of the rate-matched sequence to M. If M<N, then a part of the bits of the coded bit sequence is punctured to match the length of the rate-matched sequence to M and the punctured bits are excluded from transmission.

Namely, in an LTE/LTE-A system, after data to be transmitted is encoded using channel coding having a specific code rate (e.g., 1/3), the code rate of the data to be transmitted is adjusted through a rate-matching procedure consisting of puncturing and repetition. When the turbo code is used as a channel code in the LTE/LTE-A system, a procedure of performing channel coding and rate-matching on each code block in the transport block processing procedure as illustrated in FIG. 1 is illustrated in FIG. 2.

Figure 2:
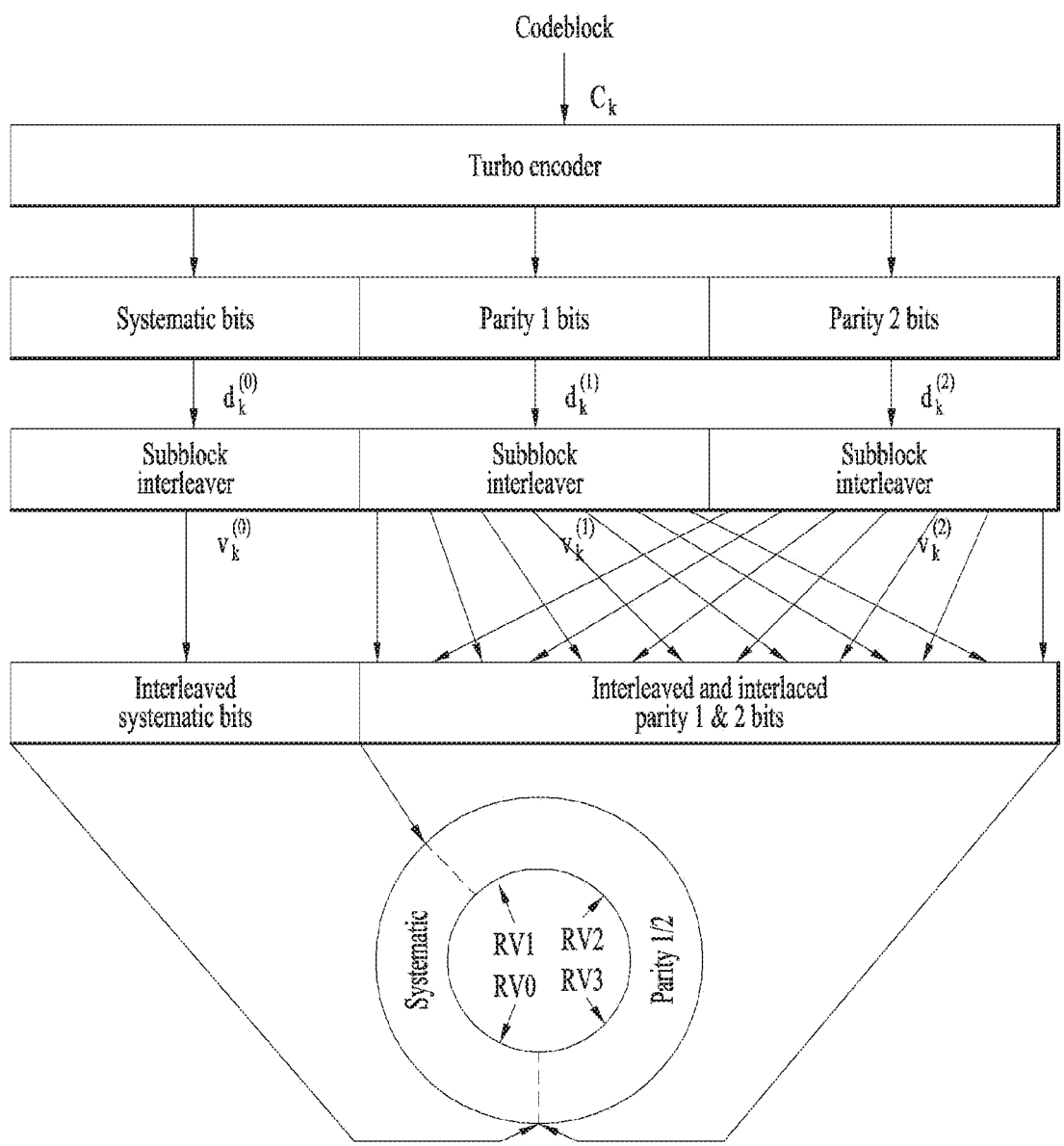
FIG. 2 is a block diagram illustrating rate matching performed by separating an encoded code block into a systematic part and a parity part.

FIG. 2 is a block diagram illustrating rate matching performed by separating an encoded code block into a systematic part and a parity part.

As illustrated in FIG. 2, the mother code rate of an LTE/LTE-A turbo encoder is 1/3. In order to obtain other code rates, if necessary, repetition or puncturing has to be performed, which are performed by a rate matching module. The rate matching module consists of three so-called sub-block interleavers for three output streams of the turbo encoder and a bit selection and pruning part, which is realized by a circular buffer. The sub-block interleaver is based on a classic row-column interleaver with 32 rows and length-32 intra-column permutation. The bits of each of the three streams are written row-by-row into a matrix with 32 columns (number of rows depends on stream size). Dummy bits are padded to the front of each stream to completely fill the matrix. After column permutation, bits are read out from the matrix column-by-column.

Figure 3:
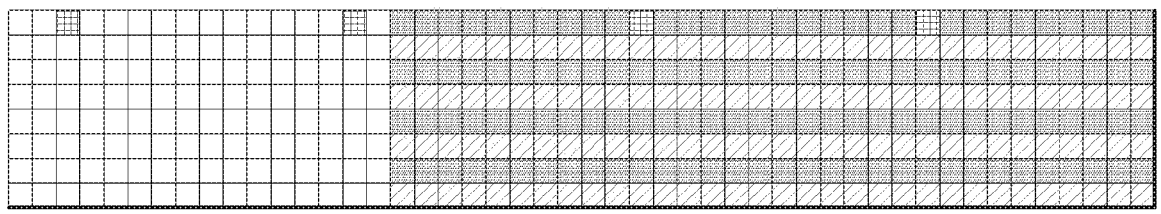
FIG. 3 illustrates an internal structure of a circular buffer.

FIG. 3 illustrates an internal structure of a circular buffer.

The circular buffer is the most important part of the rate matching module, making it possible to perform puncturing and repetition of a mother code. Referring to FIG. 2, the interleaved systematic bits are written into the circular buffer in sequence, with the first bit of the interleaved systematic bit stream at the beginning of the buffer. The interleaved and interlaced parity bit streams are written into the buffer in sequence, with the first bit of the stream next to the last bit of the interleaved systematic bit stream. Coded bits (depending on code rate) are read out serially from a certain starting point specified by redundancy version (RV) points in the circular buffer. If the coded bits reaches the end of the circular buffer and more coded bits are needed for transmission (in the case of a code rate smaller than 1/3), a transmitting device wraps around and continues at the beginning of the circular buffer.

HARQ, which stands for Hybrid ARQ, is an error correction mechanism based on retransmission of packets, which are detected with errors. The transmitted packet arrives at a receiving device after a certain propagation delay. The receiving device produces ACK for the case of error-free transmission or NACK for the case of detection of some errors. ACK/NACK is produced after some processing time and sent back to the transmitting device and arrives at the transmitting device after a propagation delay. In the case of NACK, after a certain processing delay in the transmitting device, a desired packet will be sent again. Bits, which are read out from the circular buffer and sent through retransmission, are different and depend on the position of the RV. There are four RVs (0, 1, 2, and 3), which define the position of a starting point at which the bits are read out from the circular buffer. Referring to FIG. 3, with the progressing number of retransmissions, the RV becomes higher and therefore fewer systematic bits and more parity bits are read out from the circular buffer for retransmission.

NR provides higher speeds and better coverage than current 4G. NR operates in a high frequency band and is required to offer speeds of up to 1 Gb/s for tens of connections or tens of Mb/s for tens of thousands of connections. To meet requirements of such an NR system, introduction of a more evolved coding scheme than a legacy coding scheme is under discussion. Since data communication arises in an incomplete channel environment, channel coding plays an important role in achieving a higher data rate for fast and error-free communication. A selected channel code needs to provide superior block error ratio (BLER) performance for block lengths and code rates of a specific range. Herein, BLER is defined as the ratio of the number of erroneous received blocks to the total number of sent blocks. In NR, low calculation complexity, low latency, low cost, and higher flexibility are demanded for a coding scheme. Furthermore, reduced energy per bit and improved region efficiency are needed to support a higher data rate. Use examples for NR networks are enhanced mobile broadband (eMBB), massive Internet of things (IoT), and ultra-reliable and low latency communication (URLLC). eMBB covers Internet access with high data rates to enable rich media applications, cloud storage and applications, and augmented reality for entertainment. Massive IoT applications include dense sensor networks for smart homes/buildings, remote health monitoring, and logistics tracking. URLLC covers critical applications that demand ultra-high reliability and low latency, such as industrial automation, driverless vehicles, remote surgery, and smart grids.

Although many coding schemes with high capacity performance at large block lengths are available, many of these coding schemes do not consistently exhibit excellent good performance in a wide range of block lengths and code rates. However, turbo codes, low-density parity check (LPDC) codes, and polar codes show promising BLER performance in a wide range of coding rates and code lengths and hence are considered to be used in the NR system. As demand for various cases such as eMBB, massive IoT, and URLLC has increased, a coding scheme providing greater channel coding efficiency than in turbo codes is needed. In addition, increase in a maximum number of subscribers capable of being accommodated by a channel, i.e., increase in capacity, has been required.

Polar codes are codes providing a new framework capable of solving problems of legacy channel codes and were invented by Arikan at Bilkent University (reference: E. Arikan, "Channel Polarization: A Method for Constructing Capacity-Achieving Codes for Symmetric Binary-Input Memoryless Channels," in IEEE Transactions on Information Theory, vol. 55, no. 7, pp. 3051-3073, July 2009). Polar codes are the first capacity-achieving codes with low encoding and decoding complexities, which were proven mathematically. Polar codes outperform the turbo codes in large block lengths while no error flow is present. Hereinafter, channel coding using the polar codes is referred to as polar coding.

Polar codes are known as codes capable of achieving the capacity of a given binary discrete memoryless channel. This can be achieved only when a block size is sufficiently large. That is, polar codes are codes capable of achieving the capacity of a channel if the size N of the codes infinitely increases. Polar codes have low encoding and decoding complexity and may be successfully decoded. Polar codes are a sort of linear block error correction codes. Multiple recursive concatenations are basic building blocks for the polar codes and are bases for code construction. Physical conversion of channels in which physical channels are converted into virtual channels occurs and such conversion is based on a plurality of recursive concatenations. If multiple channels are multiplied and accumulated, most of the channels may become better or worse. The idea underlying polar codes is to use good channels. For example, data is sent through good channels at rate 1 and data is sent through bad channels at rate 0. That is, through channel polarization, channels enter a polarized state from a normal state.

Figure 4:
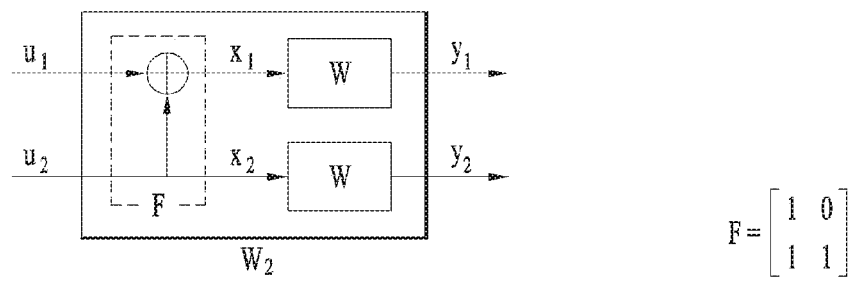
FIG. 4 is a block diagram for a polar code encoder.

FIG. 4 is a block diagram for a polar code encoder.

FIG. 4(a) illustrates a base module of a polar code, particularly, first level channel combining for polar coding. In FIG. 4(a), $W_2$ denotes an entire equivalent channel obtained by combining two binary-input discrete memoryless channels (B-DMCs), Ws. Herein, $u_1$ and $u_2$ are binary-input source bits and $y_1$ and $y_2$ are output coded bits. Channel combining is a procedure of concatenating the B-DMCs in parallel.

FIG. 4(b) illustrates a base matrix F for the base module. The binary-input source bits $u_1$ and $u_2$ input to the base matrix F and the output coded bits $x_1$ and $x_2$ of the base matrix F have the following relationship.

$$[u_1 u_2]\begin{bmatrix} 1 & 0 \\ 1 & 1 \end{bmatrix} = [x_1 x_2] \quad \text{Equation 1}$$

The channel $W_2$ may achieve symmetric capacity I(W) which is a highest rate. In the B-DMC W, symmetric capacity is an important parameter which is used to measure a rate and is a highest rate at which reliable communication can occur over the channel W. The B-DMC may be defined as follows.

$$I(W) = \sum_{y \in Y} \sum_{x \in X} 1/2 W(y|x) \log \frac{w(y|x)}{1/2 w(y|0) + 1/2 w(y|1)} \quad \text{Equation 2}$$

It is possible to synthesize or create a second set of N binary input channels out of N independent copies of a given B-DMC W and the channels have the properties $\{W_N^{(i)}: 1 \le i \le N\}$. If N increases, there is a tendency for a part of the channels to have capacity approximating to 1 and for the remaining channels to have capacity approximating to 0. This is called channel polarization. In other words, channel polarization is a process of creating a second set of N channels $\{W_N^{(i)}: 1 \le i \le N\}$ using N independent copies of a given B-DMC W. The effect of channel polarization means that, when N increases, all symmetric capacity terms $\{I(W_N^{(i)})\}$ tend towards 0 or 1 for all except a vanishing fraction of indexes i. In other words, the concept behind channel polarization in the polar codes is transforming N copies (i.e., N transmissions) of a channel having a symmetric capacity of I(W) (e.g., additive white Gaussian noise channel) into extreme channels of capacity close to 1 or 0. Among the N channels, an I(W) fraction will be perfect channels and an 1-I(W) fraction will be completely noise channels. Then, information bits are transmitted only through good channels and bits input to the other channels are frozen to 1 or 0. The amount of channel polarization increases along with a block length. Channel polarization consists of two phases: channel combining phase and channel splitting phase.

Figure 5:
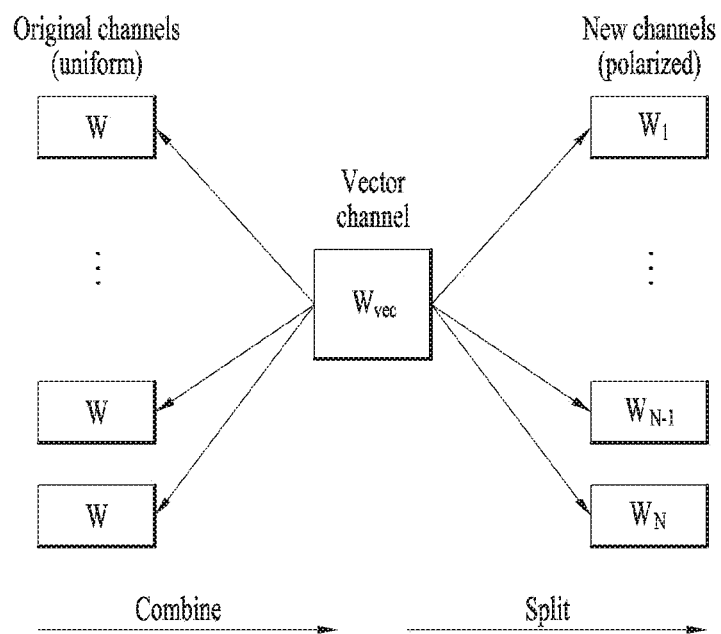
FIG. 5 illustrates the concept of channel combining and channel splitting for channel polarization.
Figure 5:
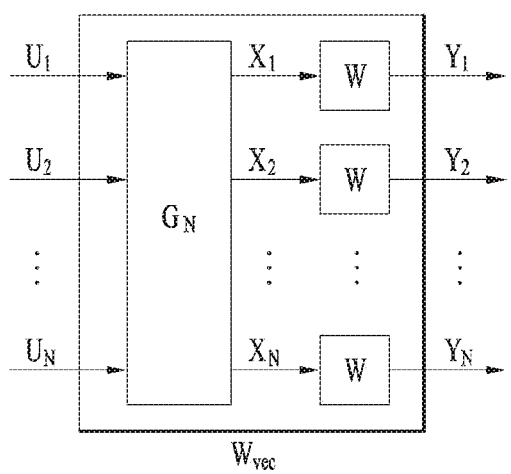

FIG. 5 illustrates the concept of channel combining and channel splitting for channel polarization. As illustrated in FIG. 5, when N copies of an original channel W are properly combined to create a vector channel $W_{vec}$ and then are split into new polarized channels, the new polarized channels are categorized into channels having capacity C(W)=1 and channels having C(W)=0 if N is sufficiently large. In this case, since bits passing through the channels having the channel capacity C(W))=1 are transmitted without error, it is better to transmit information bits therethrough and, since bits passing through the channels having capacity C(W)=1 cannot transport information, it is better to transport frozen bits, which are meaningless bits, therethrough.

Referring to FIG. 5, copies of a given B-DMC W are combined in a recursive manner to output a vector channel $W_{vec}$ given by $X_N \to Y_N$, where $N=2^n$ and n is an integer equal to or greater than 0. Recursion always begins at the 0th level and $W_1$=W. If n is 1 (n=1), this means the first level of recursion in which two independent copies of $W_1$ are combined. If the above two copies are combined, a channel $W_2$: $X_2 \to Y_2$ is obtained. A transitional probability of this new channel $W_2$ may be represented by the following equation.

$$W_2(y_1, y_2 | u_1, u_2) = W(y_1 | u_1 \oplus u_2) W(y_1 | u_2) \quad \text{Equation 3}$$

If the channel $W_2$ is obtained, two copies of the channel $W_2$ are combined to obtain a single copy of a channel $W_4$. Such recursion may be represented by $W_4: X_4 \to Y_4$ having the following transitional probability.

$$W_4(y_1^4 | u_1^4) = W_2(y_1^2 | u_1 \oplus u_2, u_3 \oplus u_4) W_2(y_3^4 | u_2, u_4) \quad \text{Equation 4}$$

In FIG. 5, $G_N$ is a size-N generator matrix. $G_2$ corresponds to the base matrix F illustrated in FIG. 4(b). $G_4$ may be represented by the following matrix.

$$G_4 = \begin{bmatrix} 1 & 0 & 0 & 0 \\ 0 & 0 & 1 & 0 \\ 0 & 1 & 0 & 0 \\ 0 & 0 & 0 & 1 \end{bmatrix} \begin{bmatrix} 1 & 0 \\ 1 & 1 \end{bmatrix}^{\otimes 2} = \begin{bmatrix} 1 & 0 & 0 & 0 \\ 1 & 0 & 1 & 0 \\ 1 & 1 & 0 & 0 \\ 1 & 1 & 1 & 1 \end{bmatrix} \quad \text{Equation 5}$$

Herein, $\square$ denotes the Kronecker product, $A^{\square n} = A \square A^{\square(n-1)}$ for all $n \ge 1$, and $A^{\square 0}=1$.

The relationship between input $u_1^N$ to $G_N$ and output $x_1^N$ of $G_N$ of FIG. 5(b) may be represented as $x_1^N = u_1^N G_N$, where $x_1^N = \{x_1, \ldots, x_N\}$, $u_1^N = (u_1, \ldots, u_N)$.

When N B-DMCs are combined, each B-DMC may be expressed in a recursive manner.

That is, $G_N$ may be indicated by the following equation.

$$G_N = B_N F^{\oplus n} \quad \text{Equation 6}$$

Herein, $N=2^n$, $n \ge 1$, $F^{\square n} = F \square F^{\square(n-1)}$, and $F^{\square 0}=1$. $B_N$ is a permutation matrix known as a bit-reversal operation and $B_N = R_N (I_2 \square B_{N/2})$ and may be recursively computed. $I_2$ is a 2-dimensional identity matrix and this recursion is initialized to $B_2 = I_2$. $R_N$ is a bit-reversal interleaver and is used to map an input $s_1^N = \{s_1, \ldots, s_N\}$ to an output $X_1^N = \{s_1, s_3, \ldots, s_{N-1}, s_2, \ldots, s_N\}$. The bit-reversal interleaver may not be included in a transmitting side. The relationship of Equation is illustrated in FIG. 6.

Figure 6:
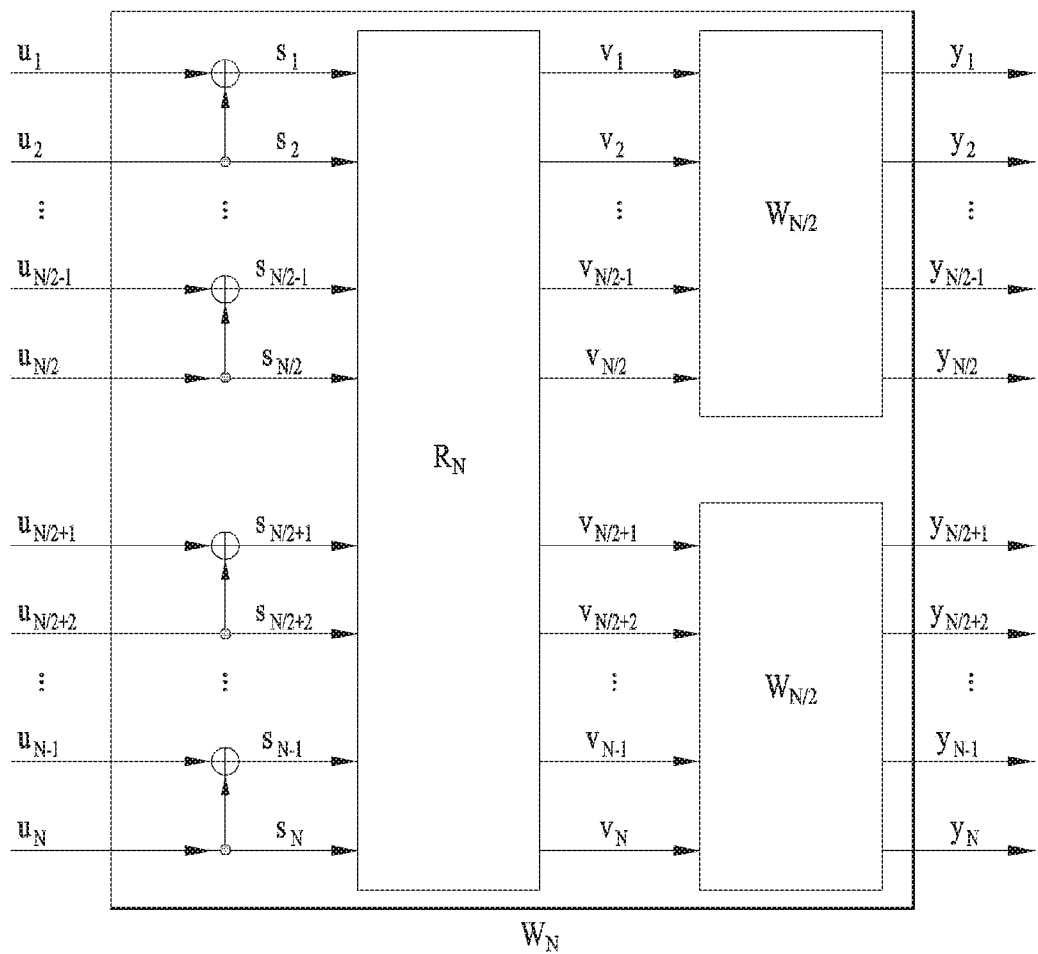
FIG. 6 illustrates N-th level channel combining for a polar code.

FIG. 6 illustrates N-th level channel combining for a polar code.

A process of defining an equivalent channel for specific input after combining N B-DMCs Ws is called channel splitting. Channel splitting may be represented as a channel transition probability indicated by the following equation.

$$W_N^i(y_1^N, u_1^{i-1} | u_i) = \sum_{u_{i+1}^N} \frac{1}{2^{N-1}} W_N(y_1^N | u_1^N) \quad \text{Equation 7}$$

Channel polarization has the following characteristics:
>Conservation: $C(W^-)+C(W^+)=2C(W)$,
>Extremization: $C(W^-) \leq C(W) \leq C(W^+)$.

When channel combining and channel splitting are performed, the following theorem may be obtained.

Theorem: For any B-DMC W, channels $\{W_N^{(i)}\}$ are polarized in the following sense. For any fixed $\delta \in \{0, 1\}$, as N goes to infinity through powers of 2, the fraction of indexes $i \in \{1, \ldots, N\}$ for channel capacity $I(W_N^{(i)}) \in (1-\delta, 1]$ goes to $I(W)$ and the faction of i for channel capacity $I(W_N^{(i)}) \in [0,\delta)$ goes to $1-I(W)$. Hence, if $N \to \infty$, then channels are perfectly noisy or are polarized free of noise. These channels can be accurately recognized by the transmitting side. Therefore, bad channels are fixed and non-fixed bits may be transmitted on good channels.

That is, if the size N of polar codes is infinite, a channel has much noise or is free of noise, with respect to a specific input bit. This has the same meaning that the capacity of an equivalent channel for a specific input bit is divided into 0 or I(W).

Inputs of a polar encoder are divided into bit channels to which information data is mapped and bit channels to which the information data is not mapped. As described earlier, according to the theorem of the polar code, if a codeword of the polar code goes to infinity, the input bit channels may be classified into noiseless channels and noise channels. Therefore, if information is allocated to the noiseless bit channels, channel capacity may be obtained. However, in actuality, a codeword of an infinite length cannot be configured, reliabilities of the input bit channels are calculated and data bits are allocated to the input bit channels in order of reliabilities. In the present invention, bit channels to which data bits are allocated are referred to as good bit channels. The good bit channels may be input bit channels to which the data bits are mapped. Bit channels to which data is not mapped are referred to as frozen bit channels. A known value (e.g., 0) is input to the frozen bit channels and then encoding is performed. Any values which are known to the transmitting side and the receiving side may be mapped to the frozen bit channels. When puncturing or repetition is performed, information about the good bit channels may be used. For example, positions of codeword bits (i.e., output bits) corresponding to positions of input bits to which information bits are not allocated may be punctured.

A decoding scheme of the polar codes is a successive cancellation (SC) decoding scheme. The SC decoding scheme obtains a channel transition probability and then calculates a likelihood ratio (LLR) of input bits using the channel transition probability. In this case, the channel transition probability may be calculated in a recursive form if channel combining and channel splitting procedures use characteristics of the recursive form. Therefore, a final LLR value may also be calculated in the recursive form. First, a channel transition probability $W_N^{(i)}(y_1^N, u_1^{i-1}|u_i)$ of an input bit $u_i$ may be obtained as follows. $u_1^i$ may be split into odd indexes and even indexes as expressed as $u_{1,o}^i$, $u_{1,e}^i$ respectively. The channel transition probability may be indicated by the following equations.

$$W_{2N}^{(2i-1)}(y_1^{2N}, u_1^{2i-1}|u_{2i-1}) = \sum_{u_{2i}^{2N}} \frac{1}{2^{2N-1}} W_{2N}(y_1^{2N}|u_1^{2N}) = \quad \text{Equation 8}$$

$$\sum_{u_{2i,o}^{2N}, u_{2i,e}^{2N}} \frac{1}{2^{2N-1}} W_N(y_1^N|u_{1,o}^{2N} \oplus u_{i,e}^{2N}) W_N(y_{N+1}^{2N}|u_{1,e}^{2N}) =$$

$$\sum_{u_{2i}} \frac{1}{2} \sum_{u_{2i+1,e}^{2N}} \frac{1}{2^{N-1}} W_N(y_{N+1}^{2N}|u_{1,e}^{2N}) \cdot$$

$$\sum_{u_{2i+1,o}^{2N}} \frac{1}{2^{N-1}} W_N(y_1^N|u_{1,o}^{2N} \oplus u_{i,e}^{2N}) =$$

$$\sum_{u_{2i}} \frac{1}{2} W_N^{(i)}(y_1^N, u_{1,o}^{2i-2} \oplus u_{1,e}^{2i-2}|u_{2i-1} \oplus u_{2i}) \cdot$$

$$W_N^{(i)}(y_{N+1}^{2N}, u_{1,e}^{2i-2}|u_{2i})$$

where $$W_N^{(i)}(y_1^N, u_1^{i-1}|u_i) = \sum_{u_{i+1}^N} \frac{1}{2^{N-1}} W_N(y_1^N|u_1^N).$$

$$W_{2N}^{(2i)}(y_1^{2N}, u_1^{2i-1}|u_{2i}) = \sum_{u_{2i+1}^{2N}} \frac{1}{2^{2N-1}} W_{2N}(y_1^{2N}|u_1^{2N}) = \quad \text{Equation 9}$$

$$\sum_{u_{2i+1,o}^{2N}, u_{2i+1,e}^{2N}} \frac{1}{2^{2N-1}} W_N(y_1^N|u_{1,o}^{2N} \oplus u_{i,e}^{2N}) W_N(y_{N+1}^{2N}|u_{1,e}^{2N}) =$$

$$\frac{1}{2} \sum_{u_{2i+1,e}^{2N}} \frac{1}{2^{N-1}} W_N(y_{N+1}^{2N}|u_{1,e}^{2N}) \cdot$$

$$\sum_{u_{2i+1,o}^{2N}} \frac{1}{2^{N-1}} W_N(y_1^N|u_{1,o}^{2N} \oplus u_{i,e}^{2N}) =$$

$$\frac{1}{2} W_N^{(i)}(y_1^N, u_{1,o}^{2i-2} \oplus u_{1,e}^{2i-2}|u_{2i-1} \oplus u_{2i}) \cdot$$

$$W_N^{(i)}(y_{N+1}^{2N}, u_{1,e}^{2i-2}|u_{2i})$$

A polar decoder retrieves information and generates an estimate $\hat{u}_1^N$ of $u_1^N$ using values (e.g., reception bits, frozen bits, etc.) known for the polar codes. The LLR is defined as follows.

$$L_N^{(i)}(y_1^N, u_1^{i-1}) = \frac{W_N^{(i)}(y_1^N, u_1^{i-1}|u_i = 0)}{W_N^{(i)}(y_1^N, u_1^{i-1}|u_i = 1)} \quad \text{Equation 10}$$

The LLR may be recursively calculated as follows.

$$L_N^{(2i-1)}(y_1^N, \hat{u}_1^{2i-2}) = \quad \text{Equation 11}$$

$$\frac{L_{N/2}^{(i)}(y_1^{N/2}, \hat{u}_{1,o}^{2i-2} \oplus \hat{u}_{1,e}^{2i-2}) \cdot L_{N/2}^{(i)}(y_{N/2+1}^N, \hat{u}_{1,e}^{2i-2}) + 1}{L_{N/2}^{(i)}(y_1^{N/2}, \hat{u}_{1,o}^{2i-2} \oplus \hat{u}_{1,e}^{2i-2}) + L_{N/2}^{(i)}(y_{N/2+1}^N, \hat{u}_{1,e}^{2i-2})}$$

$$L_N^{(2i)}(y_1^N, \hat{u}_1^{2i-1}) =$$

$$[L_{N/2}^{(i)}(y_1^{N/2}, \hat{u}_{1,o}^{2i-2} \oplus \hat{u}_{1,e}^{2i-2})]^{1-2\hat{u}_{2i-1}} \cdot L_{N/2}^{(i)}(y_{N/2+1}^N, \hat{u}_{1,e}^{2i-2})$$

Recursive calculation of LLRs is traced back to a code length of 1 with an LLR $L_1^{(1)}(y_i)=W(y_i|0)/W(y_i|1)$. $L_1^{(1)}(y_i)$ is soft information observed from a channel.

The complexity of a polar encoder and an SC decoder varies with the length N of polar codes and is known as having $O(N\log N)$. Assuming that K input bits are used for a length-N polar code, a coding rate becomes N/K. If a generator matrix of a polar encoder of a data payload size N is $G_N$, an encoded bit may be represented as $x_1^N = u_1^N G_N$. It is assumed that K bits out of $u_1^N$ correspond to payload bits, a row index of $G_N$ corresponding to the payload bits is i, and a row index of $G_N$ corresponding to (N-K) bits is F. A minimum distance of the polar codes may be given as $d_{min}(C) = \min_{i \in I} 2^{wt(i)}$, where wt(i) is the number of 1s within binary extension of i and $i=0, 1, \ldots, N-1$.

SC list (SCL) decoding is an extension of a basic SC decoder. In this type of decoder, L decoding paths are simultaneously considered in each decoding stage. Herein, L is an integer. In other words, in the case of the polar codes, a list-L decoding algorithm is an algorithm for simultaneously tracking L paths in a decoding process.

Figure 7:
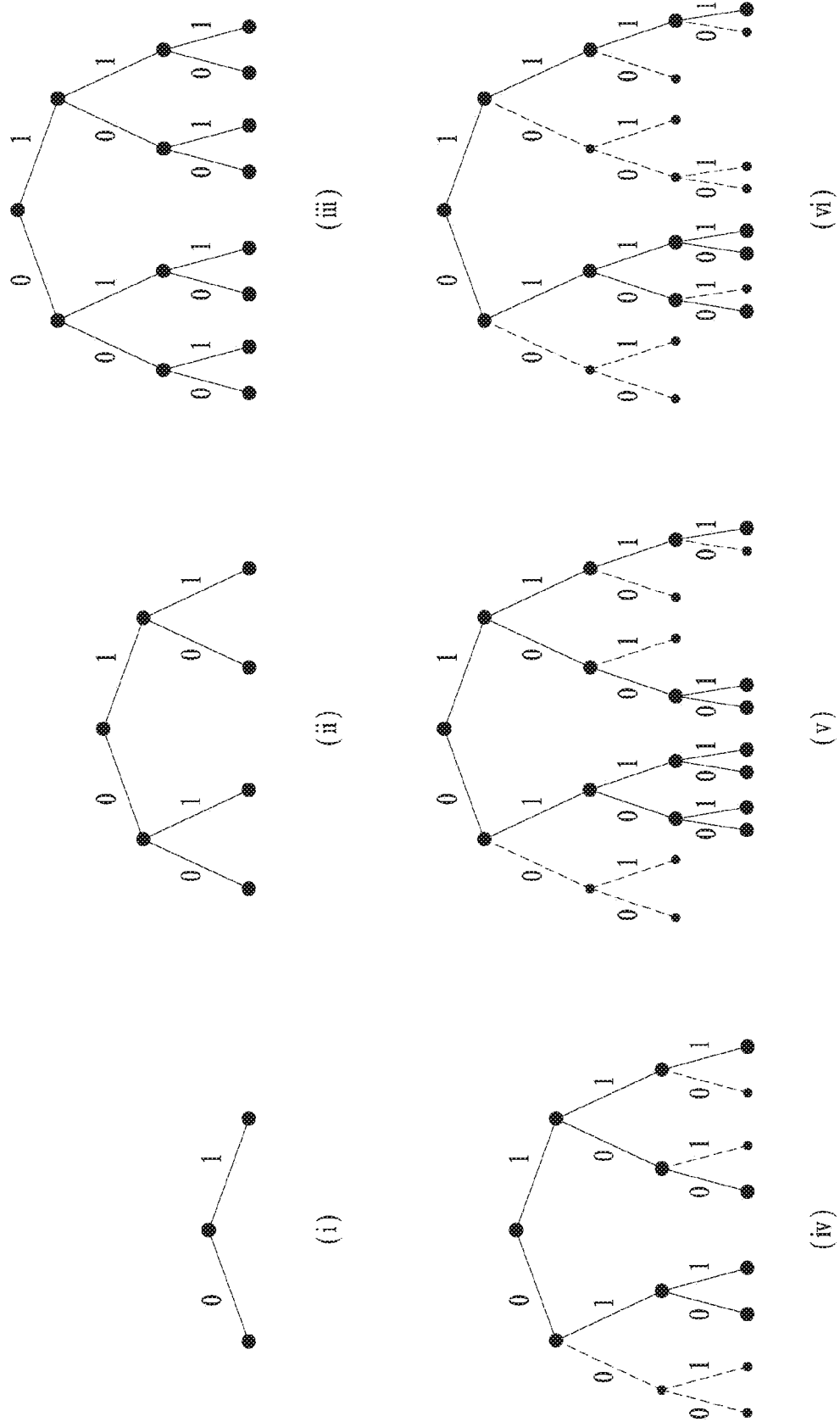
FIG. 7 illustrates an evolution of decoding paths in a list-L decoding process.

FIG. 7 illustrates an evolution of decoding paths in a list-L decoding process. For convenience of description, it is assumed that the number of bits that should be determined is n and all bits are not frozen. If a list size L is 4, each level includes at most 4 nodes with paths that continue downward. Discontinued paths are expressed by dotted lines in FIG. 7. A process in which decoding paths evolve in list-L decoding will now be described with reference to FIG. 7. i) If list-L decoding is started, the first unfrozen bit may be either 0 or 1. ii) list-L decoding continues. The second unfrozen bits may be either 0 or 1. Since the number of paths is not greater than L=4, pruning is not needed yet. iii) Consideration of all options for the first bit (i.e., a bit of the first level), the second bit (i.e. a bit of the second level), and the third bit (i.e., a bit of the third level) results in 8 decoding paths which are excessive because L=4. iv) the 8 decoding paths are pruned to L (=4) promising paths. v) 4 active paths continue by considering two options of the fourth unfrozen bit. In this case, the number of paths is doubled, i.e., 8 paths which are excessive because L=4. vi) The 8 paths are pruned back to L (=4) best paths. In the example of FIG. 7, 4 candidate codewords 0100, 0110, 0111, and 1111 are obtained and one of the codewords is determined to be a codeword most similar to an original codeword. In a similar manner to a normal decoding process, for example, in a pruning process or a process of determining a final codeword, a path in which the sum of LLR absolute values is largest may be selected as a survival path. If a CRC is present, the survival path may be selected through the CRC.

Meanwhile, CRC-aided SCL decoding is SCL decoding using CRC and improves the performance of polar codes. CRC is the most widely used technique in error detection and error correction in the field of information theory and coding. For example, if an input block of an error correction encoder has K bits and the length of information bits is k, and the length of CRC sequences is m bits, then K=k+m. CRC bits are a part of source bits for an error correction code. If the size of channel codes used for encoding is N, a code rate R is defined as R=K/N. CRC aided SCL decoding serves to detect an errorless path while a receiving device confirms a CRC code with respect to each path. An SCL decoder outputs candidate sequences to a CRC detector. The CRC detector feeds back a check result in order to aid in determining a codeword.

Although complicated as compared with an SC algorithm, SCL decoding or CRC aided SCL decoding has an advantage of excellent decoding performance. For more details of a list-X decoding algorithm of the polar codes, refer to 'I. Tal and A. Vardy, "List decoding of polar codes," in Proc. IEEE Int. Symp. Inf. Theory, pp. 1-5, July 2011'.

In the polar codes, code design is independent of a channel and hence is not versatile for mobile fading channels. In addition, the polar codes have a disadvantage of limited application because the codes have recently been introduced and have not grown yet. That is, polar coding proposed up to now has many parts that have not been defined to apply to a wireless communication system. Therefore, the present invention proposes a polar coding method suitable for the wireless communication system.

Figure 8:
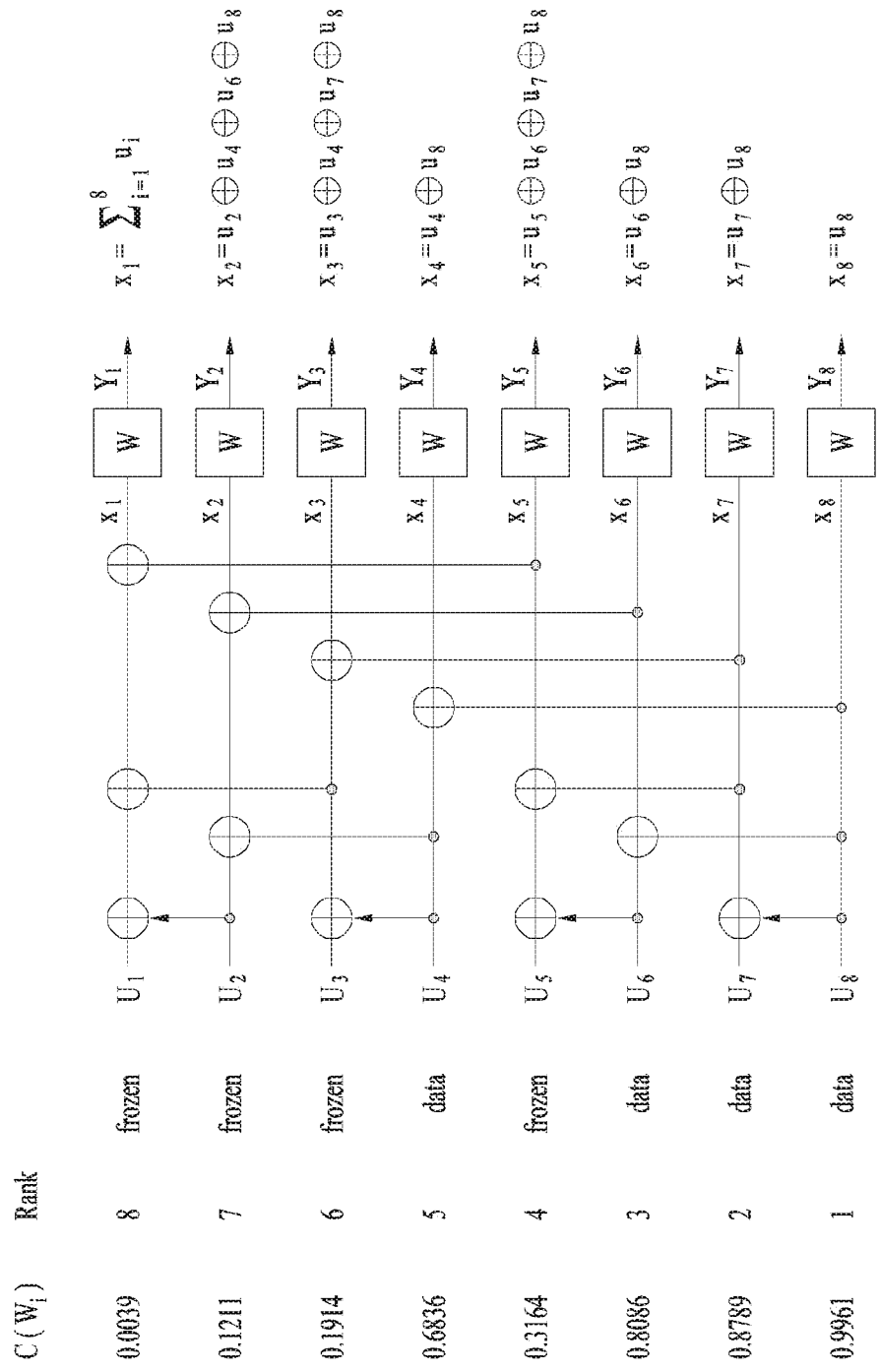
FIG. 8 illustrates the concept of selecting position(s) to which information bit(s) are to be allocated in polar codes.

FIG. 8 illustrates the concept of selecting position(s) to which information bit(s) are to be allocated in polar codes.

In FIG. 8, it is assumed that the size N of mother codes is 8, i.e., the size N of polar codes is 8, and a code rate is ½.

In FIG. 8, $C(W_i)$ denotes the capacity of a channel $W_1$ and corresponds to the reliability of channels that input bits of a polar code experience. When channel capacities corresponding to input bit positions of the polar code are as illustrated in FIG. 8, reliabilities of the input bit positions are ranked as illustrated in FIG. 8. To transmit data at a code rate of ½, a transmitting device allocates 4 bits constituting the data to 4 input bit positions having high channel capacities among 8 input bit positions (i.e., input bit positions denoted as $U_4$, $U_6$, $U_7$, and $U_4$ among input bit positions $U_1$ to $U_8$ of FIG. 8) and freezes the other input bit positions. A generator matrix $G_8$ corresponding to the polar code of FIG. 8 is as follows. The generator matrix $G_8$ may be acquired based on Equation 6.

$$W_{2N}^{(2i-1)}(y_1^{2N}, u_1^{2i-1} | u_{2i-1}) = \sum_{u_{2i}^{2N}} \frac{1}{2^{2N-1}} W_{2N}(y_1^{2N} | u_1^{2N}) = \quad \text{Equation 12}$$

$$\sum_{u_{2i,o}^{2N}, u_{2i,e}^{2N}} \frac{1}{2^{2N-1}} W_N(y_1^N | u_{1,o}^{2N} \oplus u_{1,e}^{2N}) W_N(y_{N+1}^{2N} | u_{1,e}^{2N}) =$$

$$\sum_{u_{2i}} \frac{1}{2} \sum_{u_{2i+1,e}^{2N}} \frac{1}{2^{N-1}} W_N(y_{N+1}^{2N} | u_{1,e}^{2N}) \cdot$$

$$\sum_{u_{2i+1,o}^{2N}} \frac{1}{2^{N-1}} W_N(y_1^N | u_{1,o}^{2N} \oplus u_{1,e}^{2N}) =$$

$$\sum_{u_{2i}} \frac{1}{2} W_N^{(i)}(y_1^N, u_{1,o}^{2i-2} \oplus u_{1,e}^{2i-2} | u_{2i-1} \oplus u_{2i}) \cdot$$

$$W_N^{(i)}(y_{N+1}^{2N}, u_{1,e}^{2i-2} | u_{2i})$$

$$\text{where } W_N^{(i)}(y_1^N, u_1^{i-1} | u_i) = \sum_{u_{i+1}^N} \frac{1}{2^{N-1}} W_N(y_1^N | u_1^N).$$

The input bit positions denoted as $U_1$ to $U_8$ of FIG. 8 correspond one by one to rows from the lowest row to the highest row of $G_8$. Referring to FIG. 8, it may be appreciated that the input bit corresponding to $U_8$ affects all output coded bits. On the other hand, it may be appreciated that the input bit corresponding to $U_1$ affects only $Y_1$ among the output coded bits. Referring to Equation 12, when binary-input source bits $U_1$ to $U_8$ are multiplied by $G_8$, a row in which the input bits appear at all output bits is the lowest row [1, 1, 1, 1, 1, 1, 1, 1] in which all elements are 1, among rows of $G_8$. Meanwhile, a row in which the binary-input source bits appears at only one output bit is a row in which one element is 1 among the rows of $G_8$, i.e., a row [1, 0, 0, 0, 0, 0, 0, 0] in which a row weight is 1. Similarly, it may be appreciated that a row in which a row weight is 2 reflects input bits corresponding to the row in two output bits. Referring to FIG. 8 and Equation 12, $U_1$ to $U_8$ correspond one by one to the rows of $G_8$ and bit indexes for distinguishing between input positions of $U_1$ to $U_8$, i.e., bit indexes for distinguishing between the input positions, may be assigned to the rows of $G_8$.

Hereinafter, a description of the present invention will be given focusing on the assumption that bit indexes from 0 to N-1 are sequentially allocated to rows of $G_N$ starting from the highest row having the smallest row weight with respect to N input bits. For example, referring to FIG. 8, a bit index 0 is allocated to the input position of $U_1$, i.e., the first row of $G_8$ and a bit index 7 is allocated to the input position of $U_8$, i.e., the last row of $G_8$. However, since the bit indexes are used to indicate input positions of the polar code, a scheme different from the above allocation scheme may be used. For example, bit indexes from 0 to N−1 may be allocated staring from the lowest row having the largest row weight.

In the case of output bit indexes, as illustrated in FIG. 8 and Equation 12, the present invention will be described under the assumption that bit indexes from 0 to N−1 or bit indexes from 1 to N are assigned to columns from the first column having the largest column weight to the last column having the smallest column weight among columns of $G_N$.

In the polar code, setting of information bits and frozen bits is one of the most important elements in the configuration and performance of the polar code. That is, determination of ranks of input bit positions may be an important element in the performance and configuration of the polar code. In the present invention, bit indexes may distinguish input or output positions of the polar code. In the present invention, a sequence obtained by enumerating reliabilities of bit positions in ascending or descending order are referred to as a bit index sequence. That is, the bit index sequence represents reliabilities of input or output bit positions of the polar code in ascending or descending order. A transmitting device inputs information bits to input bits having high reliabilities based on the input bit index sequence and performs encoding using the polar code. A receiving device may discern input positions to which information bits are allocated or input positions to which frozen bits are allocated, using the same or corresponding input bit index sequence. That is, the receiving device may perform polar decoding using an input bit sequence which is identical to or corresponds to an input bit index sequence used by the transmitting device and using a corresponding polar code. In the following description, it is assumed that an input bit sequence is predetermined so that information bit(s) may be allocated to input bit position(s) having high reliabilities.

A method of performing polar coding using a known bit as a frozen bit and a method using '0' as the known bit are widely used. If information other than '0' is transmitted at a frozen bit position, the information transmitted at the frozen bit position has a relatively low recovery probability because an input bit position having a low reliability among input bit positions is usually used as the frozen bit position. However, if information (hereinafter, a reserved bit), which is already known through other channels, is used as the frozen bit, a low recovery probability at a decoder may have no problem. That is, since already known information does not need to be included in a coded bit, the known information need not be actually transmitted through channel coding. Hence, in the case of the already known information, a recovery probability of corresponding information is not important. Even when the reserved bit is used as the frozen bit in the polar code, an error probability of an information bit is not improved. However, according to the proposal of the present invention, if a UE ID (e.g., cell-radio network temporary identifier (C-RNTI)) is used as the reserved bit, a false alarm ratio (FAR) in which a target UE ID of a signal is mistaken for another UE ID may be improved. In the present invention, the UE ID may be a UE ID of the transmitting device performing polar encoding or may be a UE ID of the receiving device performing polar decoding.

Figure 9:
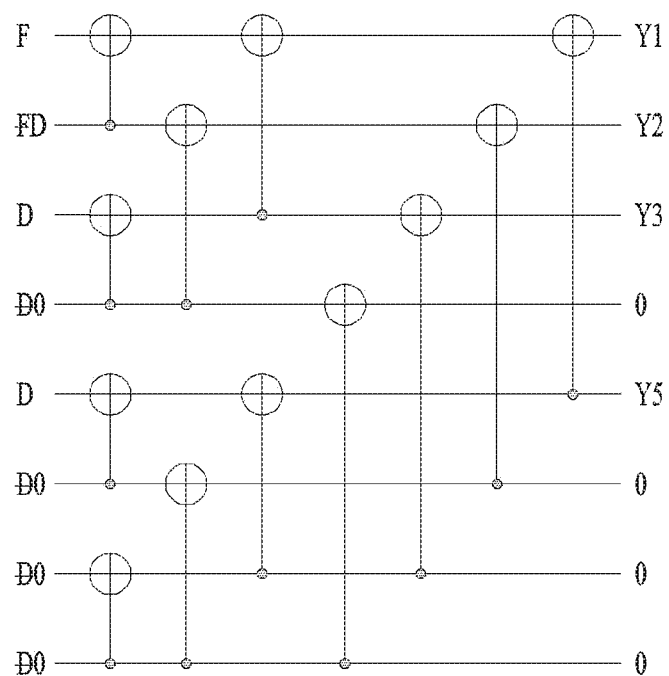
FIG. 9 illustrates puncturing and information bit allocation according to the present invention.

FIG. 9 illustrates puncturing and information bit allocation according to the present invention. In FIG. 9, F denotes a frozen bit, D denotes an information bit, and 0 denotes a skipping bit.

Among coded bits, the case in which an information bit is changed to a frozen bit may occur according to an index or position of a punctured bit. For example, if output coded bits for a mother code of N=8 should be punctured in order of Y8, Y7, Y6, Y4, Y5, Y3, Y2, and Y1 and a target code rate is ½, then Y8, Y7, Y6, and Y4 are punctured, U8, U7, U6, and U4 connected only to Y8, Y7, Y6, and Y4 are frozen to 0, and these input bits are not transmitted, as illustrated in FIG. 9. An input bit changed to a frozen bit by puncturing of a coded bit is referred to as a skipping bit or a shortening bit and a corresponding input position is referred to as a skipping position or a shortening position. Shortening is a rate matching method of inserting a known bit into an input bit position connected to a position of an output bit desired to be transmitted while maintaining the size of input information (i.e., the size of information blocks). Shortening is possible starting from input corresponding to a column in which a column weight is 1 in a generator matrix $G_N$ and next shortening may be performed with respect to input corresponding to a column in which a column weight is 1 in a remaining matrix from which a column and row in which a column weight is 1 are removed. To prevent all information bits from being punctured, an information bit that should have been allocated to an information bit position may be reallocated in order of a high reliability within a set of frozen bit positions.

In the case of the polar code, decoding may be generally performed in the following order.

>1. Bit(s) having low reliabilities are recovered. Although reliability differs according to the structure of a decoder, since an input index in an encoder (hereinafter, an encoder input index) having a low value usually has a low reliability, decoding is generally performed staring from a low encoder input index.

>2. When a known bit is present in a recovered bit, the known bit is used together with the recovered bit or the process of 1 is omitted and a known bit for a specific input bit position is immediately used, thereby recovering an information bit, which is an unknown bit. The information bit may be a source information bit (e.g., a bit of a transport block) or a CRC bit.

Figure 10:
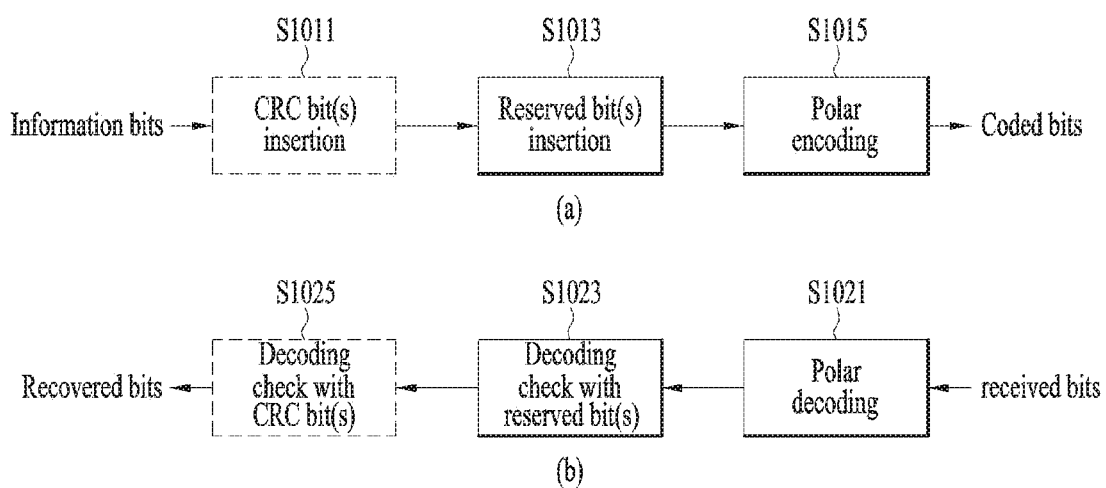
FIG. 10 illustrates a polar encoding process and a polar decoding process of the present invention for improving a false alarm ratio (FAR).

FIG. 10 illustrates a polar encoding process and a polar decoding process of the present invention for improving a false alarm ratio (FAR).

Referring to FIG. 10(*a*), the polar encoding process according to the present invention includes adding a CRC code/sequence to information bits (S1011), adding reserved bit(s)(S1013), and then performing polar encoding on CRC-added information bits and the reserved bit(s) (S1015), thereby producing coded bits. The reserved bits may be added to the front or end of the information bits or may be inserted between the information bits. Alternatively, the reserved bits may be masked to the information bits through an XOR operation between the information bits and the reserved bits.

In the present invention, decoding may be performed in a reverse order of the encoding process of FIG. 10(*a*). Referring to FIG. 10(*b*), a receiving device receiving the coded bits performs polar decoding on the received bits (S1021) and obtains the decoded bit(s). Next, the reserved bits may be used to check original information of the decoded bits (S1023). For example, if the reserved bits are a UE ID and a transmitting device masks the UE ID to the input bits through an XOR operation between the UE ID and the input bits, the receiving device may generate decoded bits with which the UE ID is XORed. The receiving device compares the UE ID obtained by recovering the received signal with an already known UE ID to determine whether the received signal is information of the receiving device (S1023). For example, if the UE ID obtained by recovering the received signal is different from the UE ID of the receiving device, the receiving device may determine that the decoded signal is not a signal therefor. Further, the receiving device may filter out the received signal once more by determining decoding success/failure through a CRC (S1025). For example, the receiving device may confirm whether a result of comparison between the UE ID thereof and the decoded UE ID is a proper result through the CRC.

In the present invention, positions of the reserved bits may be selected/determined as follows and may be differently selected/determined as needed.

Option 1. Since decoding is performed starting from a bit having the lowest reliability, reserved bit(s) may be positioned starting from a bit position having the lowest reliability.

Option 2. The reserved bit(s) may be positioned at bit(s) having the highest reliability among frozen bits. In other words, the reserved bit(s) may be positioned at frozen bit position(s) in descending order of reliability starting from a bit position having the highest reliability among input positions to which frozen bits are allocated. This method may reduce an FAR by allocating the reserved bits to bits having the highest recovery probability among the frozen bits.

Option 3. The reserved bit(s) may be positioned at bit(s) having the highest reliability among information bits. In other words, the reserved bit(s) may be positioned at information bit position(s) in descending order of reliability starting from a bit position having the highest reliability among input positions to which information bits (including a CRC bit) are allocated. The information bits may be input to input bit positions having relatively high reliabilities among the other input bit positions except for input bit position(s) occupied by the reserved bit(s). According to this method, since a recovery probability of the reserved bit(s) is highest among all bits, the method may serve to reduce the FAR when the CRC is limited.

When the reserved bits are allocated to input bit positions according to Option 1, Option 2, and/or Option 3, all or a part of the reserved bits may be allocated. Alternatively, two or more of Option 1, Option 2, and Option 3 may be used according to priority of the reserved bits. When the UE ID is used as the reserved bits, since it is inefficient to allocate only a part of the UE ID to the input bit positions, it may be impossible to allocate the UE ID to the input positions by the above option(s) if the size of frozen bits to which all of the UE ID is to be allocated is not secured. In this case, masking for information bit(s) using the UE ID (e.g., XOR between the UE and the information bit(s)) may be performed.

The present invention may perform masking for the reserved bits to a part of coded bits. In this case, since a UE which does not the reserved bits cannot demask a masked reception signal, an error probability of decoded bits increases and thus decoding performance deteriorates. Hence, the present invention can reduce the probability, i.e., the FAR, that a UE not having the reserved bits used for masking in the transmitting device or a UE using other reserved bits mistakes signals for other UEs for signals therefor. Positions to which the reserved bit(s) are allocated may be determined according to reliability of coded bits.

In the present invention, the reserved bit(s), e.g., the UE ID, may aid in performing early termination of decoding in order to reduce decoding latency. Hypothesis decision using a path metric for a list size during polar decoding (see 'R1-1706194, "On channel coding for very small control block lengths," Huawei, RAN1 #88bis') has been proposed as an implementation scheme for early termination. The early termination scheme according to the hypothesis decision may be performed as follows. Notations used to describe the hypothesis decision are as follows.

N: codeword length.

K: information block length (e.g., the size of transport blocks).

L: list size of polar decoder.

PM[i,1], i=1, 2, . . . , N, 1=1, 2, . . . , L: i-th path metric for i-th input index. The sum of path metrics is normalized such that a maximum value is 1.

$i_{TH}$: start input index to check early termination criterion.

Δ: window size to check early termination criterion.

Thr: threshold value for early termination.

max: function to fine maximum value of arguments.

Early termination may be performed using path metrics with the following criterion.

>For decoding index $i_{TH}$,i=$i_{TH}$+Δ, check if max{PM [i,1]}>Thr.

>If the above condition fails, stop decoding and declare an error.

When CRC bit(s) or parity bit(s) are added to the early termination scheme, decoding may be performed as follows. For example, assuming that a 3-bit CRC is used, decoding may be performed as follows.

>at decoding index i*,

>>perform 3 cyclic redundancy checks (hereinafter, CRC-check) with some parts of information bits+CRC bits, i.e., using parts of information bits and CRC bits;

>>check if $max_{1 \square B}${PM[i*,1]}>Thr (condition 2) where B includes path indexes to pass the CRC-check;

>>stop decoding when either "all paths fail to perform the CRC-check" or "condition 2" fails.

Figure 11:
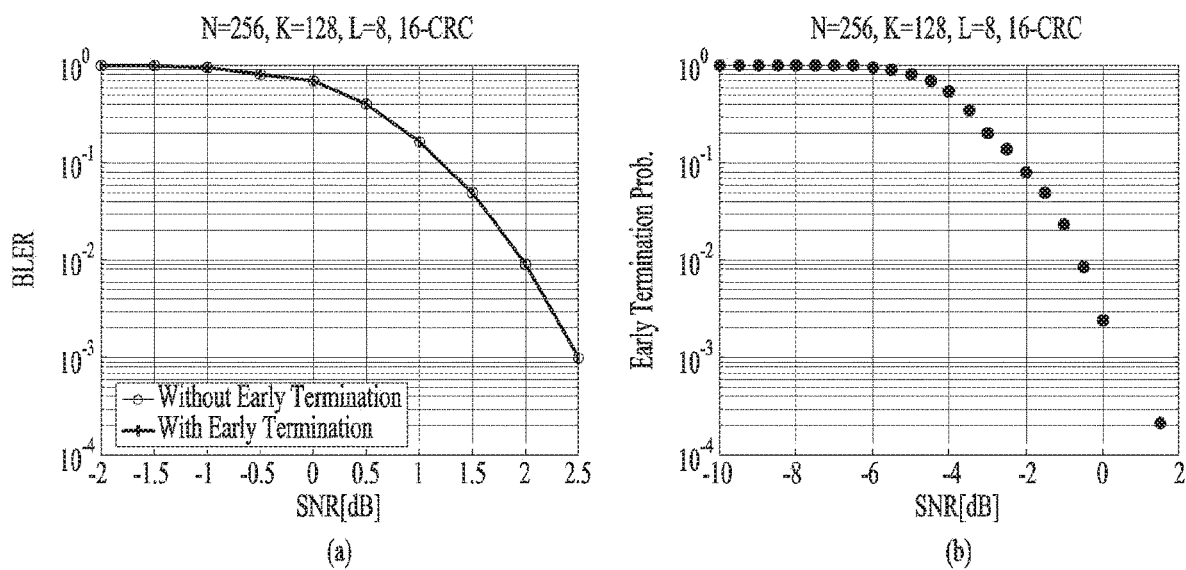
FIG. 11 illustrates block error ratio (BLER) performance and an early termination probability for polar encoding/decoding according to the present invention.

FIG. 11 illustrates BLER performance and an early termination probability for polar encoding/decoding according to the present invention.

Only when a UE ID is correctly decoded, a receiving device can confirm whether a received signal is information thereof and thus can effectively perform early termination. Assuming that performance of UE ID decoding does not deteriorate, since BLER performance of the present invention having early termination is identical to legacy BLER performance without early termination as illustrated in FIG. 11(a), path metric based early termination may be implemented according to the present invention without degrading BLER performance. As illustrated in FIG. 11(a), an early termination probability of a legacy polar encoding/decoding method is '0', whereas the present invention can obtain the early termination probability as illustrated in FIG. 11(b) even when there is no degradation in BLER performance in the present invention. Therefore, in the present invention, the receiving device may quickly recognize that received information is not information therefor upon receiving information for other receiving devices and may terminate decoding.

A recovery probability of a UE ID may differ according to a position to which a bit of the UE ID is allocated. Since a polar decoder performs decoding starting from a position having a low reliability among frozen bits, a trade-off between a BLER and average latency may occur according to a UE ID position.

Option a. The UE ID may be positioned at a side having the lowest reliability among frozen bits. That is, the UE ID may be positioned at positions having the lowest reliability among frozen bit positions. In this case, since the BLER of the UE ID is relatively low, an early termination probability may be high. Since early termination may be performed after the UE ID is decoded, latency may be lowest.

Option b. The UE ID may be positioned at a side having the highest reliability among frozen bits. That is, the UE ID may be positioned at positions having the highest reliability among frozen bit positions. In this case, the BLER is better than in Option a but the early termination probability may be lower than Option a and decoding latency may increase as compared with Option a.

Option c. The UE ID may be positioned at a side having a middle reliability among the frozen bits. That is, the UE ID may be positioned at positions having a middle reliability among the frozen bit positions. Option c has characteristics of a medium between Option a and Option b.

Option d. The UE ID may be included in information bit position(s). An information bit of an information bit position to which the UE ID is allocated may move to a position having the highest reliability among the frozen bit positions. For example, when the number of information bits is N and the number of reserved bits is 1, since one of N input bit positions having the highest reliability is used for the reserved bit, the information bit sequence except for an information bit that should be allocated to an information bit position used by the reserved bit are allocated to N−1 existing information bit positions and the information bit that should have been allocated to the information bit position used by the reserved bit may be allocated to a frozen bit position having the highest reliability among the frozen bit positions. Alternatively, the same number of bit positions having high reliabilities among frozen bit positions as the number of information bit positions to which the UE ID is allocated may be changed to information bit positions. For example, when the number of information bits is N and the number of reserved bits is 1, since one of N input bit positions having the highest reliability is used for the reserved bit, an information bit sequence is sequentially allocated to the other positions except for an information bit position used by the reserved bit and the last one bit of the information bit sequence may be allocated to a frozen bit position having the highest reliability among the frozen bit positions. BLER may be worsened due to an information bit moving to an original frozen bit position. However, since the reliability of the UE ID increases, the BLER of the UE ID may be raised. If the BLER of the UE ID is raised, signals for the receiving device may be clearly distinguished from signals for other users upon performing blind detection for the signals (e.g., control channels) directed to the receiving device.

Option e. The UE ID may be positioned at a side having the lowest reliability among information bits. That is, the UE ID may be positioned at positions having the lowest reliability among information bit positions. In this case, since a code rate is raised, BLER may be lowered. However, since the reliability of the UE ID increases, the BLER of the UE ID may be raised. In addition, since the UE ID is positioned at an information bit position, FAR performance may be raised through CRC-check. Alternatively, since the UE ID is positioned at the information bit position, signals for the receiving device may be clearly distinguished from signals for other users upon performing blind detection for the signals (e.g., control channels) directed to the receiving device.

An (allocation) position of the UE ID may be determined according to requirements of a system to which the present invention is applied.

To raise an early termination effect, masking may be performed with respect to a length of reserved or known bit(s) or more. Herein, the UE ID may be used as the reserved or known bit(s). In addition, a slot index (i.e., a time resource unit index) or information from downlink control information (DCI) and/or uplink control information (UCI) may be used as the reserved or known bit(s). Hereinafter, the present invention will be described under the assumption that the UE ID is the reserved or known signal for convenience of description.

In the present invention, the early termination effect can be raised by increasing the length of the UE ID. The UE ID is fixed to 16 bits in the LTE/LTE-A system. When the length of the UE ID is fixed to a specific length, a certain sequence including the UE ID, longer than the specific length, may be used in the present invention. In the present invention, a sequence in which the reserved or known bit (e.g., UE ID) is included may be generated as follows. Hereinafter, the present invention will be described by referring to a sequence in which the reserved or known bit is included as to a UE ID sequence.

FIG. 12 illustrates sequences in which reserved or known bit(s) of the present invention are included. In FIG. 12, it is assumed that the reserved or known bit(s) are a UE ID and the UE ID is a 4-bit sequence ABCD consisting of A, B, C, and D of 4 bits.

Referring to FIG. 12(a) and FIG. 12(b), a UE ID sequence of a desired length may be obtained by repeating the UE ID. If the desired sequence length is not a multiple of an integer of the UE ID, the UE ID sequence of a desired length may be obtained by eliminating a part of the UE ID to be included in the last of the sequence of the desired length and repeating the UE ID. FIG. 12(a) illustrating the case in which the UE ID sequence is generated by repeating the entire UE ID and FIG. 12(b) illustrates the case in which the UE ID sequence is generated by sequentially repeating each bit of the UE ID the number of specific times. The method illustrated in FIG. 12(a) may include a method of inserting the UE ID according to reliability of frozen bits for early termination. For example, ABCD, ABCD, . . . may be sequentially mapped to frozen bit positions according to reliability of frozen bit positions. In this case, early termination is possible even when only one set of ABCD rather than repetition of ABCD is decoded. When necessary, for example, bits of the UE ID are mixed and repeated to generate the UE ID sequence of a desired length according to an order of UE ID bits for which decoding should be first performed. For example, since reliability and a decoded order are not accurately equal, even if ABCD corresponding to the UE ID is allocated by the transmitting device based on reliability, an actually decoded order in the receiving device may be ABBCCD and, in consideration of this fact, the UE ID may be mixed and repeated in the form of ABBCCD in the transmitting device.

The length of the UE ID may be extended using a well-known sequence such as an m-sequence. In this case, in order to clearly distinguish between UE ID sequences as the length of a UE ID sequence becomes short, a sequence which is known as having good performance (e.g., randomization performance) even when the length of the UE ID sequence is short may be used. The UE ID sequence may be generated in consideration of the UE ID (e.g., UE ID itself and/or UE ID length), information length K, mother code length N, codeword length M, and frozen bit length considering a rate matching scheme. Thereamong, the same sequence may be used for some parameters. In other words, some parameters among the UE ID, K, N, M, and frozen bit length may not be used. For example, if K is not used as a parameter, the same sequence is used even when K varies. Not only the UE ID but also the slot index and the information from the DCI and/or UCI may be used to generate the UE sequence and various information may be simultaneously used to generate the UE ID sequence. In addition, the UE ID sequence may be configured by reflecting characteristics of a sequence such as an m-sequence. For example, the UE ID sequence of a specific length may be obtained by applying a different cyclic shift value according to the UE ID in a similar way to the m-sequence. In other words, the length of the UE ID sequence may vary according to UE IDs or UE ID groups and a sequence generator may generate UE ID sequences of different lengths using different cyclic shift values.

In the present invention, methods of masking the UE ID may be broadly divided into two methods.

Masking Method 1. Masking UE ID to Frozen Bit Position(s)

According to masking Method 1, since a decoder may first decode a frozen bit position, an early termination effect can be improved. Since legacy frozen bits are all set to '0', the UE ID sequence may be inserted into frozen bit position(s). The UE ID sequence may be generated as in FIG. 12(c) or FIG. 12(d) according to parameters (e.g., UE ID, K, N, M, and frozen bit length). In addition, the UE ID sequence may be generated as a maximum length according to some parameters and then may be regenerated as a desired short length. When it is assumed that the UE ID sequences illustrated in FIG. 12(a) and FIG. 12(b) are UE ID sequences of a maximum length, the UE ID sequence of FIG. 12(c), shorter than the UE ID sequence of FIG. 12(a), may be obtained from the UE ID sequence of FIG. 12(a) and the UE ID sequence of FIG. 12(d), shorter than the UE ID sequence of FIG. 12(b), may be obtained from the UE ID sequence of FIG. 12(b). The UE ID sequence illustrated in FIG. 12(c) may be obtained by eliminating the last or first part of the UE ID sequence of a maximum length or by performing cyclic repetition so that the UE ID sequence may have a desired length. The UE ID sequence illustrated in FIG. 12(d) may be obtained by reducing the number of repetitions for a part of the UE ID.

When a sequence is pre-generated by reflecting a rate matching scheme, a sequence of a corresponding length is generated. However, when a sequence is generated without considering the rate matching scheme, the length of the sequence should be adjusted according to the rate matching scheme. The method illustrated in FIG. 12(c) may easily adjust the length of the sequence according to the rate matching scheme. For example, when skipping occurs due to puncturing, since the length of frozen bits is reduced by a length corresponding to occurrence of skipping, the length of the UE ID sequence may be adjusted according to the method illustrated in FIG. 12(c).

Masking Method 2. Masking to a Codeword of Polar Code

The UE ID sequence may be masked to an output sequence of a polar code, i.e., a codeword. Masking Method 2 in which the UE ID sequence is masked to the codeword may vary depending on whether masking is performed before or after rate matching is applied to the codeword. If masking to the codeword is performed prior to rate matching, rate matching is performed after a UE ID sequence of a maximum length is masked to the codeword. If masking to the codeword is performed after rate matching, a rate-matched codeword is masked using a UE ID sequence having an adjusted length.

If a reserved or known sequence is masked only to a part of a codeword, a position to which the reserved or known sequence (e.g., a UE ID or a UE ID sequence obtained from the UE ID) is masked may be as follows.

A. Order of codeword(s) including relatively many frozen bits among codewords: this method serves to increase a minimum distance between a codeword part associated with a corresponding frozen bit and the UE ID in order to perform early termination starting from a frozen bit.

B. Order of codeword(s) including relatively many information bits among codewords: this method serves to increase a minimum distance between a codeword part associated with a corresponding information bit and the UE ID in order to perform early termination starting from an information bit.

When a known sequence is masked only to a partial codeword, the length of the known sequence may be a length with which it is easy to generate and apply the sequence. In this case, a maximum length of the known sequence may not exceed the length of an actually transmitted codeword. Alternatively, when the length of the known sequence is longer than the length of the actually transmitted codeword, masking may be applied prior to rate matching. For example, if a length-N known sequence is applied to a length-M (where N>M) codeword, a length-M sequence out of the known sequence is masked to the codeword through an XOR operation and the other length-(N-M) sequence and a part of the codeword may be masked through the XOR operation. If rate matching is applied at the transmitting side, some bits to which masking is applied are punctured and hence an LLR value for the punctured bits among the masked bits becomes '0' or infinity at the receiving side. If masking is performed upon a bit, an LLR value at the receiving side of which becomes '0', i.e., if masking is performed upon a bit punctured at the transmitting side, since the distance between UE IDs (e.g., the distance between UE IDs for distinguishing between users) is not influenced by masking, the same effect as the case in which masking is not performed occurs. For example, when a sequence of a short length is S1, a sequence of a long length is S2 and it is desired to reduce S2 to S1 through rate matching, a new sequence of a short length need not be produced and S1 may be obtained by puncturing S2. However, when shortening with puncturing different from simple puncturing is performed, since an LLR is not '0', (simple) puncturing may use a length-M sequence and puncturing with shortening may use a length-N sequence, with respect to the same M. That is, the length of a sequence applied may vary according to a rate matching scheme. For example, puncturing may be divided based on a predetermined code rate such that puncturing is performed with respect to a code rate lower than the predetermined code rate and puncturing with shortening is performed with respect to a code rate higher than the predetermined code rate. Herein, puncturing with shortening means that puncturing is performed in a codeword and shortening is performed due to skipping at an input side of a polar code. Skipping a specific input bit position means that an information bit skips the specific input bit position and is allocated to an input bit position having the next high reliability. Shortening means that a known bit is allocated to a skipped bit position. When puncturing is applied, since a bit having an LLR of '0' in the receiving side occurs, the length of a sequence used for masking may be reduced.

Masking may be performed upon both a frozen bit and a codeword. In this case, the same sequence may be used. Alternatively, different sequences may be used for masking of the frozen bit and masking of the codeword in order to increase a minimum distance between UE IDs.

In the present invention, '0' may be input, like a legacy scheme, to frozen bit positions, except for a frozen bit position to which a UE ID or a UE ID sequence is allocated or a frozen bit position to which an information bit is input due to a UE ID or a UE ID sequence allocated to an information bit position.

Figure 13:
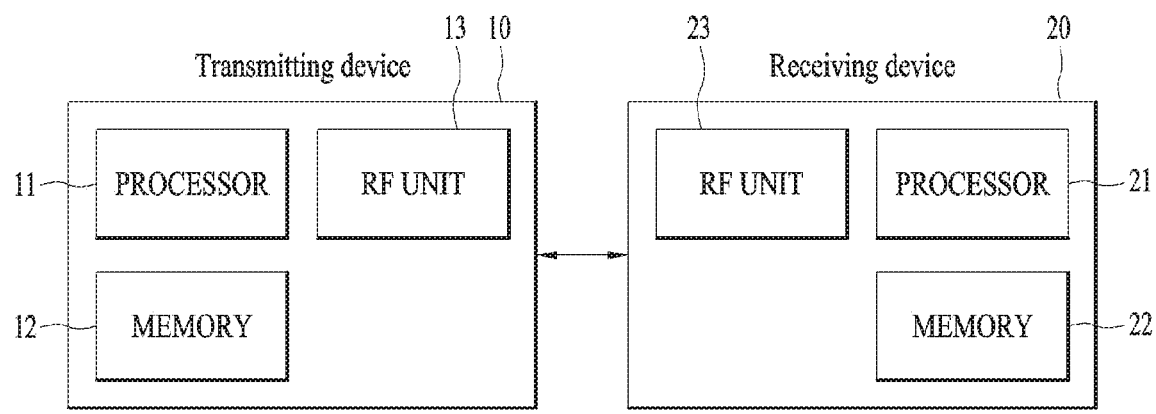
FIG. 13 is a block diagram illustrating elements of a transmitting device 10 and a receiving device 20 for implementing the present invention.

FIG. 13 is a block diagram illustrating elements of a transmitting device 10 and a receiving device 20 for implementing the present invention.

The transmitting device 10 and the receiving device 20 respectively include Radio Frequency (RF) units 13 and 23 capable of transmitting and receiving radio signals carrying information, data, signals, and/or messages, memories 12 and 22 for storing information related to communication in a wireless communication system, and processors 11 and 21 operationally connected to elements such as the RF units 13 and 23 and the memories 12 and 22 to control the elements and configured to control the memories 12 and 22 and/or the RF units 13 and 23 so that a corresponding device may perform at least one of the above-described embodiments of the present invention.

The memories 12 and 22 may store programs for processing and controlling the processors 11 and 21 and may temporarily store input/output information. The memories 12 and 22 may be used as buffers.

The processors 11 and 21 generally control the overall operation of various modules in the transmitting device and the receiving device. Especially, the processors 11 and 21 may perform various control functions to implement the present invention. The processors 11 and 21 may be referred to as controllers, microcontrollers, microprocessors, or microcomputers. The processors 11 and 21 may be implemented by hardware, firmware, software, or a combination thereof. In a hardware configuration, application specific integrated circuits (ASICs), digital signal processors (DSPs), digital signal processing devices (DSPDs), programmable logic devices (PLDs), or field programmable gate arrays (FPGAs) may be included in the processors 11 and 21. Meanwhile, if the present invention is implemented using firmware or software, the firmware or software may be configured to include modules, procedures, functions, etc. performing the functions or operations of the present invention. Firmware or software configured to perform the present invention may be included in the processors 11 and 21 or stored in the memories 12 and 22 so as to be driven by the processors 11 and 21.

The processor 11 of the transmitting device 10 performs predetermined coding and modulation for a signal and/or data scheduled to be transmitted to the outside by the processor 11 or a scheduler connected with the processor 11, and then transfers the coded and modulated data to the RF unit 13. For example, the processor 11 converts a data stream to be transmitted into K layers through demultiplexing, channel coding, scrambling, and modulation. The coded data stream is also referred to as a codeword and is equivalent to a transport block which is a data block provided by a MAC layer. One transport block (TB) is coded into one codeword and each codeword is transmitted to the receiving device in the form of one or more layers. For frequency up-conversion, the RF unit 13 may include an oscillator. The RF unit 13 may include $N_t$ (where $N_t$ is a positive integer) transmit antennas.

A signal processing process of the receiving device 20 is the reverse of the signal processing process of the transmitting device 10. Under control of the processor 21, the RF unit 23 of the receiving device 20 receives radio signals transmitted by the transmitting device 10. The RF unit 23 may include $N_r$ (where $N_r$ is a positive integer) receive antennas and frequency down-converts each signal received through receive antennas into a baseband signal. The processor 21 decodes and demodulates the radio signals received through the receive antennas and restores data that the transmitting device 10 intended to transmit.

The RF units 13 and 23 include one or more antennas. An antenna performs a function for transmitting signals processed by the RF units 13 and 23 to the exterior or receiving radio signals from the exterior to transfer the radio signals to the RF units 13 and 23. The antenna may also be called an antenna port. Each antenna may correspond to one physical antenna or may be configured by a combination of more than one physical antenna element. The signal transmitted from each antenna cannot be further deconstructed by the receiving device 20. An RS transmitted through a corresponding antenna defines an antenna from the view point of the receiving device 20 and enables the receiving device 20 to derive channel estimation for the antenna, irrespective of whether the channel represents a single radio channel from one physical antenna or a composite channel from a plurality of physical antenna elements including the antenna. That is, an antenna is defined such that a channel carrying a symbol of the antenna can be obtained from a channel carrying another symbol of the same antenna. An RF unit supporting a MIMO function of transmitting and receiving data using a plurality of antennas may be connected to two or more antennas.

The transmitting device 10 may be configured to include a polar encoder according to the present invention and the receiving device 20 may be configured to include a polar decoder according to the present invention. For example, the processor 11 of the transmitting device 10 may be configured to perform polar encoding according to the present invention and the processor 21 of the receiving device 20 may be configured to perform polar decoding according to the present invention. That is, the polar encoder according to the present invention may be configured as a part of the processor 11 of the transmitting device 10 and the polar decoder according to the present invention may be configured as a part of the processor 21 of the receiving device 20.

In the present invention, the processor 11 of the transmitting device 10 may be configured to input bits including D-bit information and an X-bit UE ID to a part of N input bit positions of a size-N polar code according to a specific bit allocation sequence. The processor 11 may encode the input bits using the polar code and control the RF unit 13 of the transmitting device 10 to transmit an encoded output sequence. The processor 11 may include the polar encoder configured to perform polar encoding. The polar encoder may include N input bit positions corresponding to N input bit positions of the polar code and N output bit positions corresponding to N output bit positions of the polar code.

The processor 11 may be configured to input the D-bit information to D input bit positions having high reliabilities among the N input bit positions and input the UE ID to input position(s) having high reliabilities among input bit positions (hereinafter, frozen bit positions) except for the D input bit positions having high reliabilities.

Alternatively, the processor 11 may be configured to input the UE ID to X information bit positions among the D input bit positions having high reliabilities. The processor 11 may be configured to input a part of the D-bit information to bit positions except for the X information bit positions to which the UE ID is input among the D input bit positions having high reliabilities and input the other information bit(s) among the D-bit information to frozen bit position(s) having high reliabilities among the frozen bit positions. The other information bit(s) may be information bit(s) corresponding to the input bit positions to which the UE ID is input among the D-bit information. For example, if a sequence arranging indexes of input bit positions in descending order of reliabilities is {8, 7, 6, 5, 4, 3, 2, 1} and 8-bit information will be input to the input bit positions in order of U8, U7, U6, U5, U4, U3, U2, and U1 when the UE ID is not present and if the processor 11 inserts the UE ID into input bit positions 6, 5, 4, and 3, the processor 11 may input U8, U7, U2, and U1 among bits of the 8-bit information to the input bit positions 8, 7, 2, and 1 and input U6, U5, U4, and U3 among the bits of the 8-bit information to frozen bit positions having relatively high reliabilities among existing frozen bit positions. Alternatively, the other information bit(s) may be information bit(s) positioned at the end of the D-bit information. For example, the processor 11 may input U8, U7, U2, and U1 among the bits of the 8-bit information to the input bit positions 8, 7, 2, and 1 and input U4, U3, U2, and U1 which are bits positioned at the end of the bits of the 8-bit information to the frozen bit positions having relatively high reliabilities among the existing frozen bit positions. The UE ID may be an UE ID of the transmitting device or a UE ID of the receiving device, which is a destination of the information.

As described above, the detailed description of the preferred embodiments of the present invention has been given to enable those skilled in the art to implement and practice the invention. Although the invention has been described with reference to exemplary embodiments, those skilled in the art will appreciate that various modifications and variations can be made in the present invention without departing from the spirit or scope of the invention described in the appended claims. Accordingly, the invention should not be limited to the specific embodiments described herein, but should be accorded the broadest scope consistent with the principles and novel features disclosed herein.

INDUSTRIAL APPLICABILITY

The embodiments of the present invention are applicable to a base station, a user equipment or other devices in a wireless communication system.

The invention claimed is:

1. A method of transmitting information by a transmitting device in a wireless communication system, the method comprising:
    inputting input bits including (i) D-bit information and (ii) an X-bit user equipment (UE) ID to a part of N input bit positions of a size-N polar code according to a specific bit allocation sequence;
    encoding the input bits using the polar code; and
    transmitting an encoded output sequence,
    wherein the N input bit positions include (i) D input bit positions having highest reliabilities among the N input bit positions and (ii) N-D frozen bit positions other than the D input bit positions,
    wherein the X-bit UE ID is input to X input bit positions among the D input bit positions, and
    wherein D-X bits among the D-bit information are input to D-X input bit positions except for the X input bit positions among the D input bit positions, and remaining X bits among the D-bit information are input to X frozen bit positions having highest reliabilities among the N-D frozen bit positions.

2. The method according to claim 1, wherein the other remaining part of the D-bit information is an end part of the D-bit information.

3. The method according to claim 1, wherein the UE ID is a UE ID of the transmitting device or a UE ID of a receiving device which is a destination of the D-bit information.

4. A transmitting device for transmitting information in a wireless communication system, the transmitting device comprising,
    a radio frequency (RF) transceiver;
    a processor, and
    a memory storing at least one program that causes the processor to perform operations comprising:
    inputting input bits including (i) D-bit information and (ii) an X-bit user equipment (UE) ID to a part of N input bit positions of a size-N polar code according to a specific bit allocation sequence;
    encoding the input bits using the polar code; and
    transmitting an encoded output sequence,
    wherein the N input bit positions include (i) D input bit positions having highest reliabilities among the N input bit positions and (ii) N-D frozen bit positions other than the D input bit positions,
    wherein the X-bit UE ID is input to X input bit positions among the D input bit positions, and
    wherein a part of the D-bit information is input to D-X input bit positions except for the X input bit positions among the D input bit positions, and a remaining part of the D-bit information is input to frozen bit positions having highest reliabilities among the N-D frozen bit positions.

5. The transmitting device according to claim 4, wherein the remaining part of the D-bit information is an end part of the D-bit information.

6. The transmitting device according to claim 4, wherein the UE ID is a UE ID of the transmitting device or a UE ID of a receiving device which is a destination of the D-bit information.

* * * * *